United States Patent
Kim et al.

(10) Patent No.: US 11,860,734 B2
(45) Date of Patent: Jan. 2, 2024

(54) SEMICONDUCTOR MEMORY DEVICES AND MEMORY SYSTEMS

(71) Applicant: Samsung Electronics Co., Ltd., Suwon-si (KR)

(72) Inventors: Sungrae Kim, Hwaseong-si (KR); Sunghye Cho, Hwaseong-si (KR); Yeonggeol Song, Seoul (KR); Kijun Lee, Seoul (KR); Myungkyu Lee, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/736,154

(22) Filed: May 4, 2022

(65) Prior Publication Data

US 2023/0119555 A1  Apr. 20, 2023

Related U.S. Application Data

(63) Continuation of application No. PCT/CN2021/100853, filed on Jun. 18, 2021.

(30) Foreign Application Priority Data

Oct. 19, 2021 (KR) ........................ 10-2021-0139195

(51) Int. Cl.
*G11C 29/00* (2006.01)
*G06F 11/10* (2006.01)
*H03M 13/11* (2006.01)
*G06F 11/07* (2006.01)

(52) U.S. Cl.
CPC ...... *G06F 11/1068* (2013.01); *G06F 11/0772* (2013.01); *G06F 11/1048* (2013.01); *H03M 13/1108* (2013.01)

(58) Field of Classification Search
CPC ............ G06F 11/1068; G06F 11/0772; G06F 11/1048; H03M 13/1108
See application file for complete search history.

(56) References Cited

U.S. PATENT DOCUMENTS

| | | |
|---|---|---|
| 8,230,305 B2 | 7/2012 | Resnick |
| 8,775,899 B2 | 7/2014 | Kamoshida |
| 8,788,904 B2 | 7/2014 | Li et al. |
| 8,990,670 B2 | 3/2015 | Ozdemir et al. |
| 9,559,726 B2 | 1/2017 | Greenspan et al. |

(Continued)

FOREIGN PATENT DOCUMENTS

KR 101587388 B1 1/2016

*Primary Examiner* — Samir W Rizk
(74) *Attorney, Agent, or Firm* — Myers Bigel, P.A.

(57) ABSTRACT

A semiconductor memory device includes a memory cell array, an on-die error correction code (ECC) engine, and a control logic circuit. The on-die ECC engine, based on an ECC, in a write operation, performs an ECC encoding on main data to generate first parity data, selectively replaces a portion of the first parity data with a poison flag to generate second parity data based on a poison mode signal, provides the main data to a normal cell region in a target page of the memory cell array, and provides the first parity data to a parity cell region in the target page or provides the poison flag and the second parity data to the parity cell region. The control logic circuit controls the on-die ECC engine and generates the poison mode signal, based on a command and an address from a memory controller.

20 Claims, 24 Drawing Sheets

(56) References Cited

U.S. PATENT DOCUMENTS

| | | |
|---|---|---|
| 9,749,448 B2 | 8/2017 | Guddeti |
| 11,061,771 B2 | 7/2021 | Schaefer et al. |
| 2019/0155685 A1* | 5/2019 | Kim .................... G06F 11/1048 |
| 2020/0117540 A1* | 4/2020 | Boehm ............... G06F 12/1425 |

* cited by examiner

FIG. 12

| | d1 | d2 | d3 | d4 | d5 | d6 | d7 | PB1 | PB2 | PB3 | PB4 | PB5 |
|---|---|---|---|---|---|---|---|---|---|---|---|---|
| ECCb ((7,5)SECDED) | 0 | 0 | 0 | 1 | 1 | 1 | 0 | 1 | 0 | 0 | 0 | 0 |
| | 1 | 1 | 0 | 1 | 1 | 0 | 1 | 0 | 1 | 0 | 0 | 0 |
| | 1 | 0 | 1 | 1 | 0 | 1 | 1 | 0 | 0 | 1 | 0 | 0 |
| | 0 | 1 | 1 | 0 | 1 | 1 | 1 | 0 | 0 | 0 | 1 | 0 |
| | 1 | 1 | 1 | 0 | 0 | 0 | 0 | 0 | 0 | 0 | 0 | 1 |

CV1 CV2 CV3 CV4 CV5 CV6 CV7 PV1 PV2 PV3 PV4 PV5

⇩

| | d1 | d2 | d3 | d4 | d5 | d6 | d7 | PF | PB2 | PB3 | PB4 | PB5 | |
|---|---|---|---|---|---|---|---|---|---|---|---|---|---|
| ECCb_M ((8,4)SEC) | 0 | 0 | 0 | 1 | 1 | 1 | 0 | 1 | 0 | 0 | 0 | 0 | Don't Care |
| | 1 | 1 | 0 | 1 | 1 | 0 | 1 | 1 | 1 | 0 | 0 | 0 | |
| | 1 | 0 | 1 | 1 | 0 | 1 | 1 | 1 | 0 | 1 | 0 | 0 | |
| | 0 | 1 | 1 | 0 | 1 | 1 | 1 | 0 | 0 | 0 | 1 | 0 | |
| | 1 | 1 | 1 | 0 | 0 | 0 | 0 | 0 | 0 | 0 | 0 | 1 | |

CV1 CV2 CV3 CV4 CV5 CV6 CV7 PV1' PV2 PV3 PV4 PV5

SEMICONDUCTOR MEMORY DEVICES AND MEMORY SYSTEMS

CROSS-REFERENCE TO RELATED APPLICATION(S)

This application claims priority under 35 U.S.C. § 119 to Korean Patent Application No. 10-2021-0139195, filed on Oct. 19, 2021, in the Korean Intellectual Property Office, the disclosure of which is incorporated by references herein in its entirety.

BACKGROUND

1. Technical Field

Example embodiments relate to memory fields, and more particularly to semiconductor memory devices and memory systems including the same.

2. Discussion of the Related Art

Semiconductor memory devices may be classified into non-volatile memory devices such as flash memory devices and volatile memory devices such as dynamic random access memories (DRAM)s. High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease.

SUMMARY

Some example embodiments provide a semiconductor memory device capable of storing a poison flag in a parity cell region without a size overhead.

Some example embodiments provide a memory system including one or more semiconductor memory devices capable of storing a poison flag in a parity cell region without a size overhead.

According to some example embodiments, a semiconductor memory device comprises a memory cell array, an on-die error correction code (ECC) engine, and a control logic circuit. The memory cell array may optionally comprise a plurality of volatile memory cells coupled to a plurality of word-lines and a plurality of bit-lines. The on-die ECC engine, based on an ECC, in a write operation, is configured to perform an ECC encoding operation on main data received from a memory controller to generate first parity data, selectively replace a portion of the first parity data with a poison flag received from the memory controller to generate second parity data based on a poison mode signal, output the second parity data and the poison flag, provide the main data to a normal cell region in a target page of the memory cell array, and provide the first parity data to a parity cell region in the target page or provide the poison flag and the second parity data to the parity cell region. The control logic circuit is configured to control the on-die ECC engine and generate the poison mode signal based on a command and an address from the memory controller.

According to some example embodiments, a memory system comprises a semiconductor memory device and a memory controller. The memory controller is configured to control the semiconductor memory device and transmit main data and a poison flag to the semiconductor memory device. The semiconductor memory device comprises a memory cell array, an on-die error correction code (ECC) engine, and a control logic circuit. The memory cell array may optionally comprise a plurality of volatile memory cells coupled to a plurality of word-lines and a plurality of bit-lines. The on-die ECC engine, based on an ECC, in a write operation, is configured to perform an ECC encoding operation on the main data to generate first parity data, selectively replace a portion of the first parity data with the poison flag to generate second parity data based on a poison mode signal, output the second parity data and the poison flag, provide the main data to a normal cell region in a target page of the memory cell array, and provide the first parity data to a parity cell region in the target page or provide the poison flag and the second parity data to the parity cell region. The control logic circuit is configured to control the on-die ECC engine and generate the poison mode signal based on a command and an address from the memory controller.

According to some example embodiments, a semiconductor memory device includes a memory cell array, an on-die error correction code (ECC) engine, and a control logic circuit. The memory cell array may optionally comprise a plurality of volatile memory cells coupled to a plurality of word-lines and a plurality of bit-lines. The on-die ECC engine, based on an ECC, in a write operation, is configured to perform an ECC encoding operation on main data received from a memory controller to generate first parity data, selectively replace a portion of the first parity data with a poison flag received from the memory controller to generate second parity data based on a poison mode signal, output the second parity data and the poison flag, provide the main data to a normal cell region in a target page of the memory cell array and provide the first parity data to a parity cell region in the target page or provide the poison flag and the second parity data to the parity cell region. The control logic circuit is configured to control the on-die ECC engine and generate the poison mode signal based on a command and an address from the memory controller. In one embodiment, in a read operation, the on-die ECC engine, in response to the poison mode signal designating a poison mode, is configured to receive the main data read from the normal cell region in the target page, receive the poison flag and the second parity data read from the parity cell region in the target page, and perform an ECC decoding operation on the main data and the poison flag based on the second parity data using the ECC to correct an error bit in the main data and the poison flag. In one embodiment, in a read operation and in response to the poison mode signal designating a normal mode, the on-die ECC engine is configured to receive the main data from the normal cell region in the target page, receive the first parity data read from the parity cell region in the target page, and perform a ECC decoding operation on the main data based on the first parity data using the ECC to correct one error bit in the main data and detect two error bits in the main data.

Accordingly, in the semiconductor memory device and the memory system according to example embodiments, the on-die ECC engine performs an ECC encoding on the main data to generate the first parity data using an ECC, replaces a portion of the first parity data with the poison flag to generate the second parity data in the poison mode, stores the poison flag and the second parity data in a parity cell region, and performs an ECC decoding operation on the main data and the poison flag based on the second parity data to protect the poison flag. That is, the semiconductor memory device may store the poison flag as meta data in the parity cell region without size overhead and the on-die ECC engine may perform the ECC encoding operation based on the ECC which is used as a different code in the normal mode as compared to the poison mode based on the poison mode signal.

BRIEF DESCRIPTION OF THE DRAWINGS

Illustrative, non-limiting example embodiments will be more clearly understood from the following detailed description taken in conjunction with the accompanying drawings.

FIG. 12 illustrates that the on-die ECC engine modifies an ECC used in the normal mode to provide a modified ECC used in the poison mode.

DETAILED DESCRIPTION OF THE EMBODIMENTS

Various example embodiments will be described more fully hereinafter with reference to the accompanying drawings, in which some example embodiments are shown.

Figure 1:
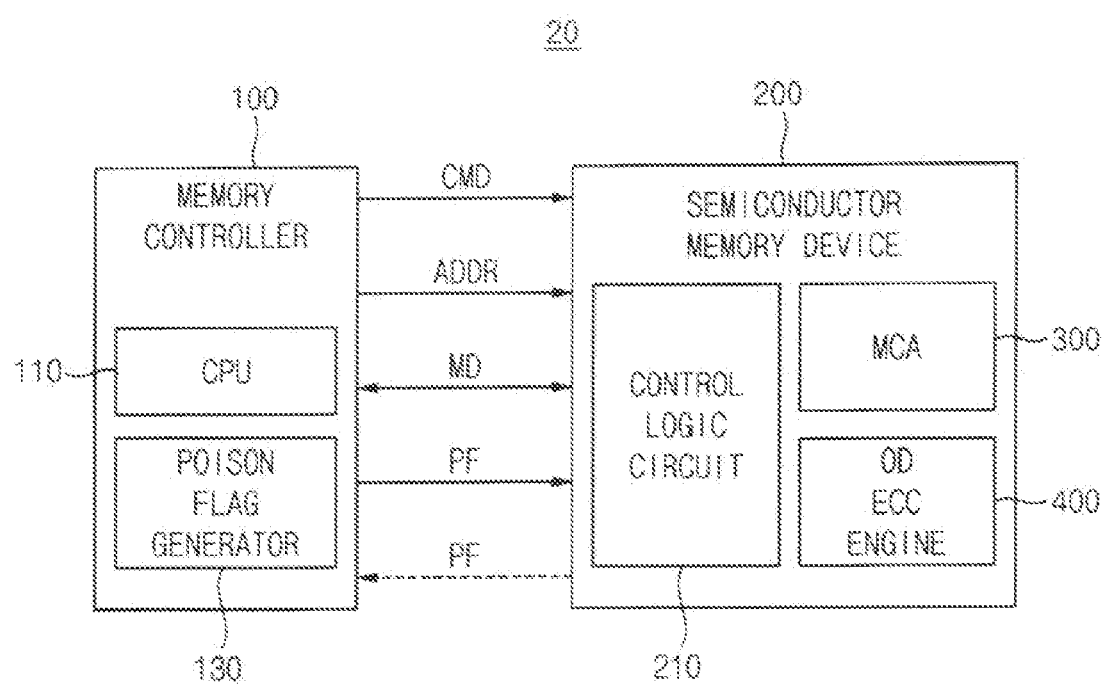
FIG. 1 is a block diagram illustrating a memory system according to example embodiments.

FIG. 1 is a block diagram illustrating a memory system according to example embodiments.

Referring to FIG. 1, a memory system 20 may include a memory controller 100 (e.g., an external memory controller) and a semiconductor memory device 200.

The memory controller 100 may control the overall operation of the memory system 20. The memory controller 100 may control the overall data exchange between an external host and the semiconductor memory device 200.

For example, the memory controller 100 may write data in the semiconductor memory device 200 or read data from the semiconductor memory device 200 in response to one or more requests from the host. In addition, the memory controller 100 may issue operation commands to the semiconductor memory device 200 for controlling the semiconductor memory device 200.

The memory controller 100 may transmit a command CMD and an address (signal) ADDR to the semiconductor memory device 200 and may exchange main data MD with the semiconductor memory device 200. In addition, the memory controller 100 may transmit, to the semiconductor memory device 200, a poison flag PF indicating whether the main data MD corresponds to poisoned data. The poisoned data may be data including an error or a bit in which an error occurs.

The semiconductor memory device 200 may transmit, to the memory controller 100, the poison flag PF indicating whether the main data MD to be transmitted to the memory controller 100 corresponds to poisoned data.

In example embodiments, the semiconductor memory device 200 is a memory device including a plurality of dynamic (volatile) memory cells such as a dynamic random access memory (DRAM), double data rate 7 (DDR7) synchronous DRAM (SDRAM), but example embodiments are not limited thereto.

The memory controller 100 may include a central processing unit (CPU) 110 and a poison flag generator 130 and the semiconductor memory device 200 may include a control logic circuit 210, a memory cell array (MCA) 300 and an on-die (OD) error correction code (ECC) engine 400.

The CPU 110 may control overall operation of the memory controller 100. The poison flag generator 130 may generate the poison flag PF under control of the CPU 110.

The memory cell array 300 may store the main data MD and may selectively store the poison flag PF.

The control logic circuit 210 may control the on-die ECC engine 400 based on the command CMD and the address ADDR and may provide a poison mode signal to the on-die ECC engine 400.

The on-die ECC engine 400, based on an ECC stored therein and in a write operation, may perform an ECC encoding operation on the main data MD received from the memory controller 100 to generate first parity data, may selectively replace a portion of the first parity data with the poison flag PF received from the memory controller 100 to generate second parity data based on a poison mode signal, may provide the main data MD to a normal cell region in a target page of the memory cell array 300, and may provide the first parity data to a parity cell region in the target page or provide the poison flag PF and the second parity data to the parity cell region. As used herein, the term "selectively replace x" or similar terms may mean to replace x based on the poison mode signal. That is, x may be replaced or not based on whether the poison mode signal indicates a normal mode or a poison mode.

The on-die ECC engine 400, in a read operation and in response to the poison mode signal designating a poison mode, may receive the main data MD read from the normal cell region in the target page, may receive the poison flag PF and the second parity data read from the parity cell region in the target page, and may perform an ECC decoding operation on the main data MD and the poison flag PF based on the second parity data using the ECC to correct an error bit in the main data MD and the poison flag PF.

The on-die ECC engine 400 may perform the ECC encoding operation to store the poison flag PF in the parity cell region and may perform the ECC decoding operation on the main data MD and the poison flag PF to protect the poison flag PF by using the ECC as a single error correction/double error detection (SECDED) code in a normal mode and by using the ECC as a single error correction (SEC) code in the poison mode. That is, the on-die ECC engine 400 may perform the ECC encoding operation and the ECC decoding operation based on the ECC which is used as a different code in the normal mode and the poison mode based on the poison mode signal. That is, a different code is used in normal mode for the ECC encoding operation and ECC decoding operation as compared to the code used if in poison mode.

Figure 2:
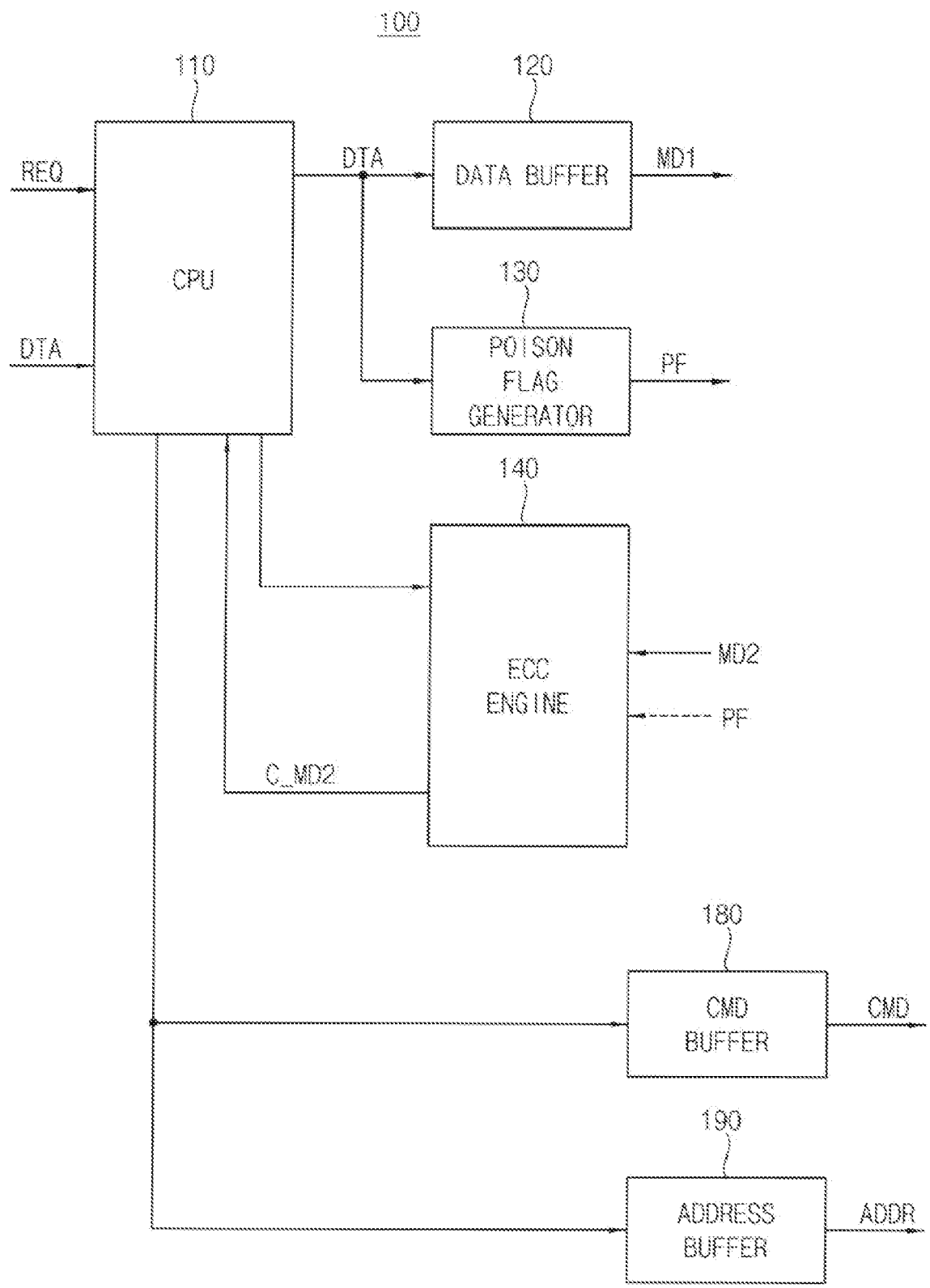
FIG. 2 is block diagram illustrating an example of the memory controller in the memory system of FIG. 1 according to example embodiments.

FIG. 2 is a block diagram illustrating an example of the memory controller in FIG. 1 according to example embodiments.

Referring to FIG. 2, the memory controller 100 may include the CPU 110 a data buffer 120, the poison flag generator 130, an ECC engine 140, a command (CMD) buffer 180 and an address buffer 190.

The CPU 110 receives a request REQ and a data DTA from a host device (not shown), and provides the data DTA to the data buffer 120 and the poison flag generator 130.

The data buffer 120 buffers the data DTA to provide a first main data MD1 to the semiconductor memory device 200 (not shown in FIG. 2).

The poison flag generator 130 generates the poison flag PF indicating whether the first main data MD1 corresponds to poisoned data based on the data DTA and transmits the poison flag PF to the semiconductor memory device 200 (not shown in FIG. 2).

The ECC engine 140, in a read operation of the semiconductor memory device 200, receives a second main data MD2 and selectively receives the poison flag PF from the semiconductor memory device 200, performs an ECC decoding on the second main data MD2 and the poison flag PF, corrects an error bit in the second main data MD2 or the poison flag PF, and provides a corrected main data C MD2 or the poison flag PF to the CPU 110.

The command buffer 180 stores the command CMD corresponding to the request REQ and transmits the command CMD to the semiconductor memory device 200 under control of the CPU 110. The address buffer 190 stores the address ADDR and transmits the address ADDR to the semiconductor memory device 200 under control of the CPU 110.

Figure 3:
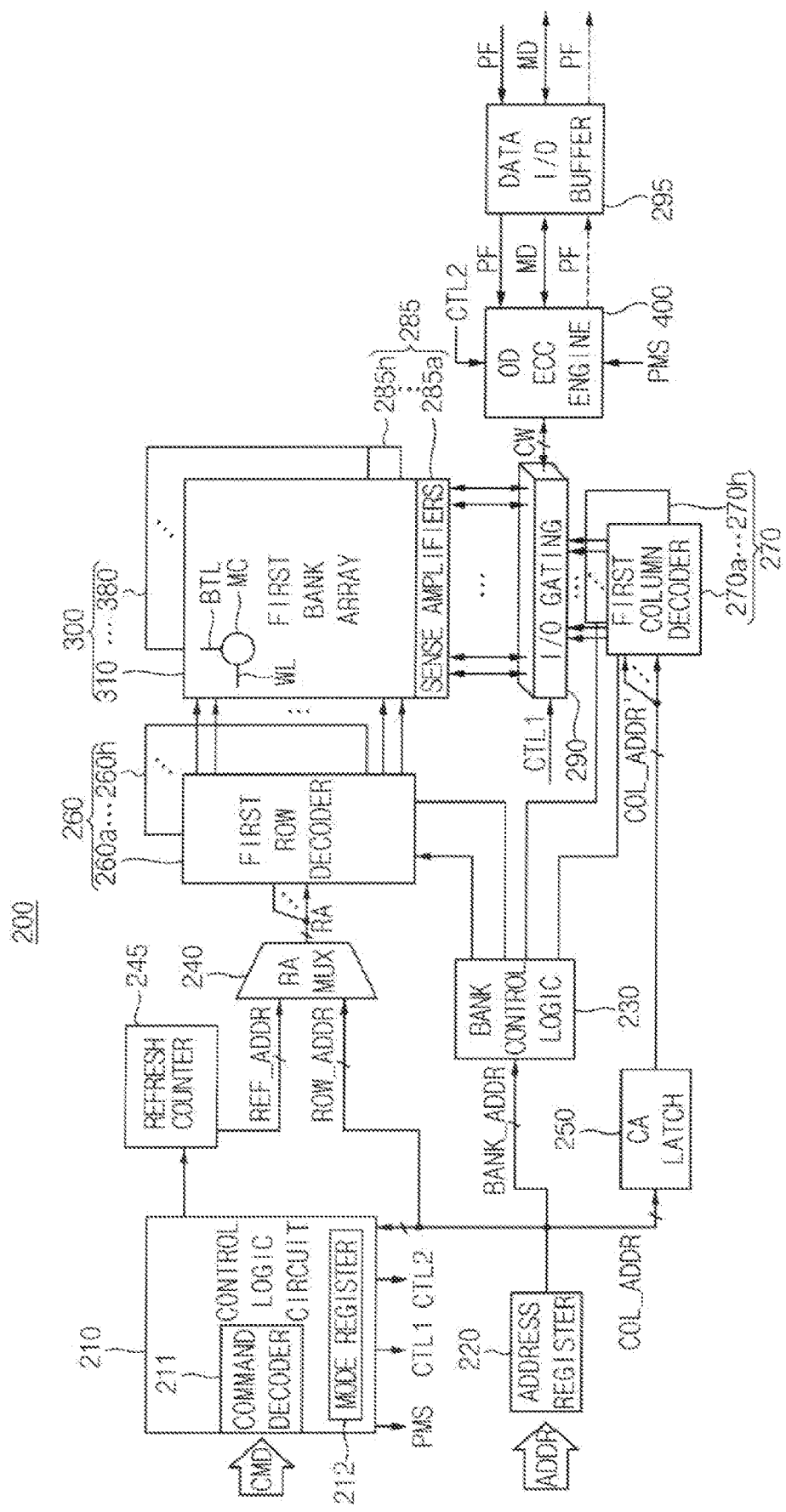
FIG. 3 is a block diagram illustrating an example of the semiconductor memory device in the memory system of FIG. 1 according to example embodiments.

FIG. 3 is a block diagram illustrating an example of the semiconductor memory device in the memory system of FIG. 1 according to example embodiments.

Referring to FIG. 3, a semiconductor memory device 200 may include the control logic circuit 210, an address register 220, a bank control logic 230, a row address multiplexer 240, a column address latch 250, a row decoder 260, a column decoder 270, the memory cell array 300, a sense amplifier unit 285, an input/output (I/O) gating circuit 290, a refresh counter 245, the on-die ECC engine 400 and a data input/output (I/O) buffer 295.

The memory cell array 300 may include first through eighth bank arrays 310~380. The row decoder 260 may include first through eighth bank row decoders 260a~260h respectively coupled to the first through eighth bank arrays 310~380, the column decoder 270 may include first through eighth bank column decoders 270a~270h respectively coupled to the first through eighth bank arrays 310~380, and the sense amplifier unit 285 may include first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 may include a plurality of memory cells MC coupled to word-lines WL and bit-lines BTL.

The address register 220 may receive an address ADDR including a bank address BANK_ADDR, a row address ROW_ADDR and a column address COL_ADDR and the command CMD from the memory controller 100.

The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses COL_ADDR' that increment from the received column address COL_ADDR. The column address latch 250 may apply the temporarily stored or generated column address COL_ADDR' to the first through eighth bank column decoders 270a~270h.

The activated one of the first through eighth bank column decoders 270a~270h may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 further may include read data latches for storing data that is output from the first through eighth bank arrays 310~380, and write drivers for writing data to the first through eighth bank arrays 310~380.

Codeword CW read from one bank array of the first through eighth bank arrays 310~380 may be sensed by a sense amplifier coupled to the one bank array from which the data is to be read, and may be stored in the read data latches. The codeword CW stored in the read data latches is ECC-decoded by the on-die ECC engine 400 and the main data MD may be provided to the data I/O buffer 295 in a normal mode and the main data MD and the poison flag PF may be provided to the data I/O buffer 295 in a poison mode. The data I/O buffer 295 may transmit the main data MD to the memory controller 100 in the normal mode and may transmit the main data MD and the poison flag PF to the memory controller 100 in the poison mode.

The main data MD to be written in one bank array of the first through eighth bank arrays 310~380 may be provided to the data I/O buffer 295 along with the poison flag PF from the memory controller 100. The data I/O buffer may provide the main data MD and the poison flag PF to the on-die ECC engine 400.

The on-die ECC engine 400, in the normal mode based on a poison mode signal PMS, may perform an ECC decoding operation on the main data MD to generate first parity data and may write a codeword CW including the main data MD and the first parity data in a target page in one of the first through eighth bank arrays 310~380 through the I/O gating circuit 290.

The on-die ECC engine 400, in the poison mode based on the poison mode signal PMS, may perform an ECC decoding operation on the main data MD to generate first parity data, may replace a portion of bits of the first parity data with the poison flag PF to generate second parity data, and may write a codeword CW including the main data MD, the second parity data, and the poison flag PF in a target page in one of the first through eighth bank arrays 310~380 through the I/O gating circuit 290.

The control logic circuit 210 may control operations of the semiconductor memory device 200. For example, the control logic circuit 210 may generate control signals for the semiconductor memory device 200 in order to perform a write operation or a read operation. The control logic circuit 210 may include a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the on-die ECC engine 400 and the poison mode signal PMS designating one of the normal mode and the poison mode and may provide the poison mode signal PMS to the on-die ECC engine 400. When the mode register 212 is set to the poison mode based on the command (or a mode register set command), the control logic circuit 210 may output the poison mode signal PMS with a first logic level in response to the mode register 212 being set to the poison mode FIG. 4 illustrates an example of the first bank array in the semiconductor memory device of FIG. 3.

Figure 4:
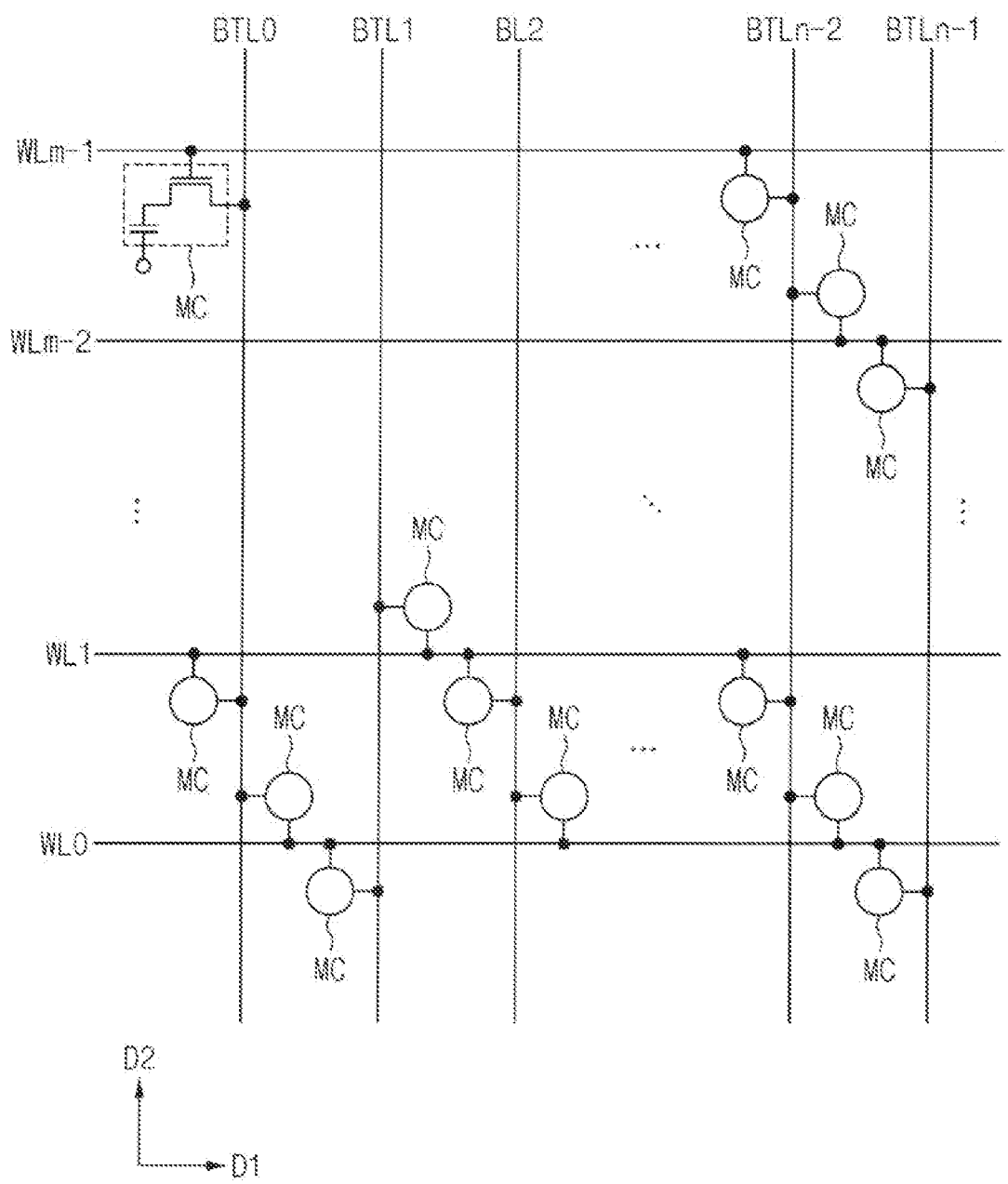
FIG. 4 illustrates an example of the first bank array in the semiconductor memory device of FIG. 3.

Referring to FIG. 4, the first bank array 310 includes a plurality of word-lines WL0~WLm−1 (where m is an even number equal to or greater than two), a plurality of bit-lines BTL0~BTLn−1 (where n is an even number equal to or greater than two), and a plurality of memory cells MCs at intersections between the word-lines WL0~WLm−1 and the bit-lines BTL0~BTLn−1.

The bit-lines BTL0~BTLn−1 may extend in a first direction D1 and the word-lines WL~WLm−1 may extend in a second direction D2.

Each of the memory cells MCs includes an access (cell) transistor coupled to one of the word-lines WL0~WLm−1 and one of the bit-lines BTL0~BTLn−1 and a storage (cell) capacitor coupled to the cell transistor. That is, each of the memory cells MCs has a DRAM cell structure.

In addition, the memory cells MCs may have different arrangement depending on whether the memory cells MCs are coupled to an even word-line (for example, WL0) or an odd word-line (for example, WL1). That is, a bit-line coupled to adjacent memory cells may be different depending on whether a word-line selected by an access address is an even word-line or an odd word-line.

Figure 5:
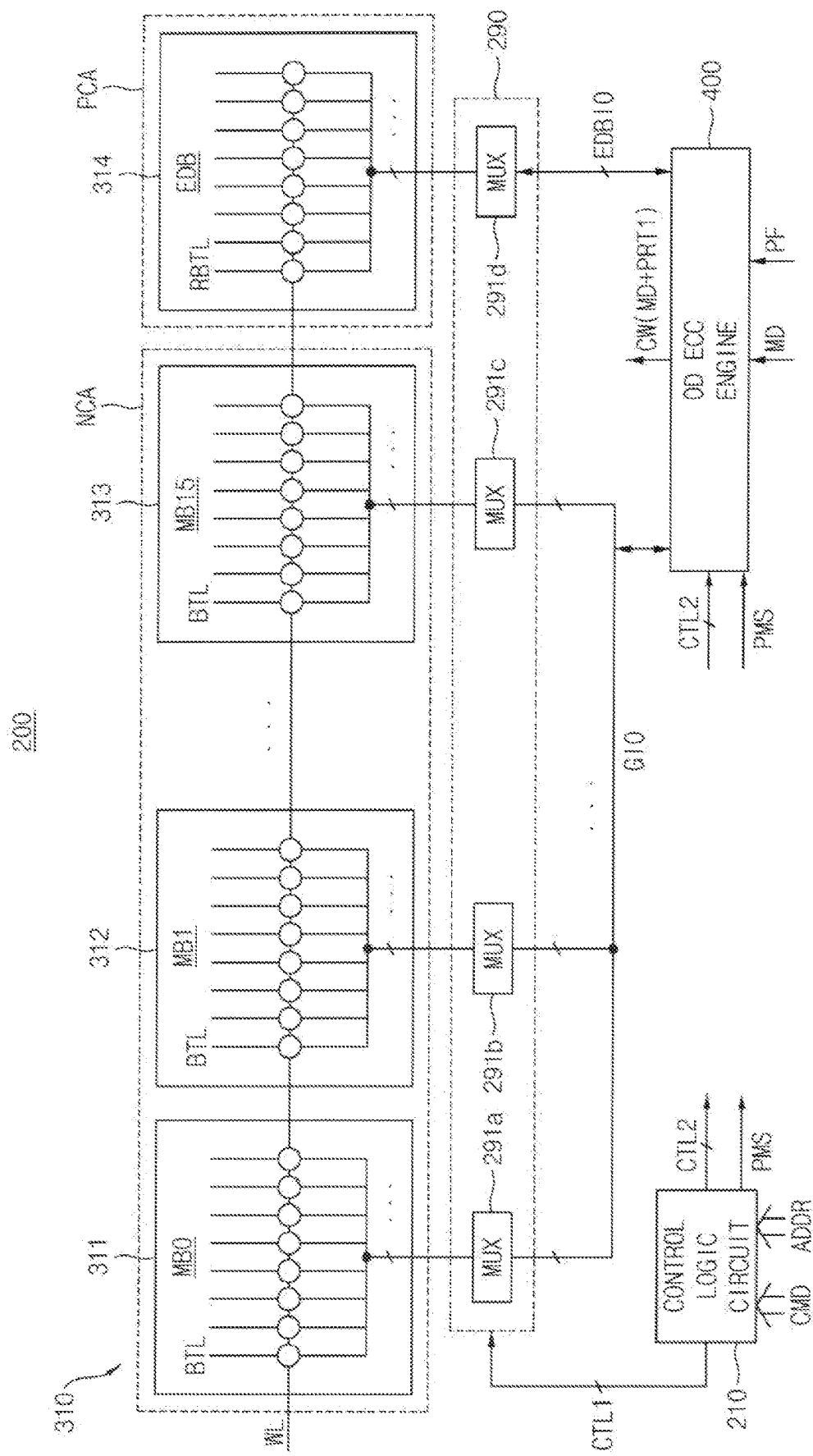
FIG. 5 illustrates a portion of the semiconductor memory device of FIG. 3 in a write operation of a normal mode.

FIG. 5 illustrates a portion of the semiconductor memory device 200 of FIG. 3 in a write operation of a normal mode.

In FIG. 5, the control logic circuit 210, the first bank array 310, the I/O gating circuit 290, and the on-die ECC engine 400 are illustrated.

Referring to FIG. 5, the first bank array 310 includes a normal cell array NCA and a parity cell array PCA. The normal cell array NCA may be referred to as a normal cell region and the parity cell array PCA may be referred to a parity cell region.

The normal cell array NCA includes a plurality of first memory blocks MB0~MB15, i.e., 311~313, and the parity cell array PCA includes at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair, and block repair to repair 'fail' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be volatile memory cells. The second memory cells connected to intersections of the word-lines WL and bit-lines RBTL may be volatile memory cells.

The I/O gating circuit 290 includes a plurality of switching circuits 291a-291d respectively connected to the first memory blocks 311~313 and the second memory block 314.

The on-die ECC engine 400 may be connected to the switching circuits 291a-291d through first data lines GIO and second data lines EDBIO. The control logic circuit 210 may receive the command CMD and the address ADDR and may decode the command CMD to provide the first control signal CTL1 for controlling the switching circuits 291*a*-291*d* to the I/O gating circuit 290 and provide the second control signal CTL2 for controlling the on-die ECC engine 400 and the poison mode signal PMS to the on-die ECC engine 400.

When the command CMD is a write command and the mode register 212 (see FIG. 3) in the control logic circuit is set to the normal mode, the control logic circuit 210 provides the second control signal CTL2 and the poison mode signal PMS designating the normal mode to the on-die ECC engine 400 and the on-die ECC engine 400 performs the ECC encoding on the main data MD to generate first parity data PRT1 based on the second control signal CTL2 and the poison mode signal PMS and provides the I/O gating circuit 290 with the codeword CW including the main data MD and the first parity data PRT1. The control logic circuit 210 provides the first control signal CTL1 to the I/O gating circuit 290 such that the codeword CW is to be stored in a target page in the first bank array 310.

Figure 6:
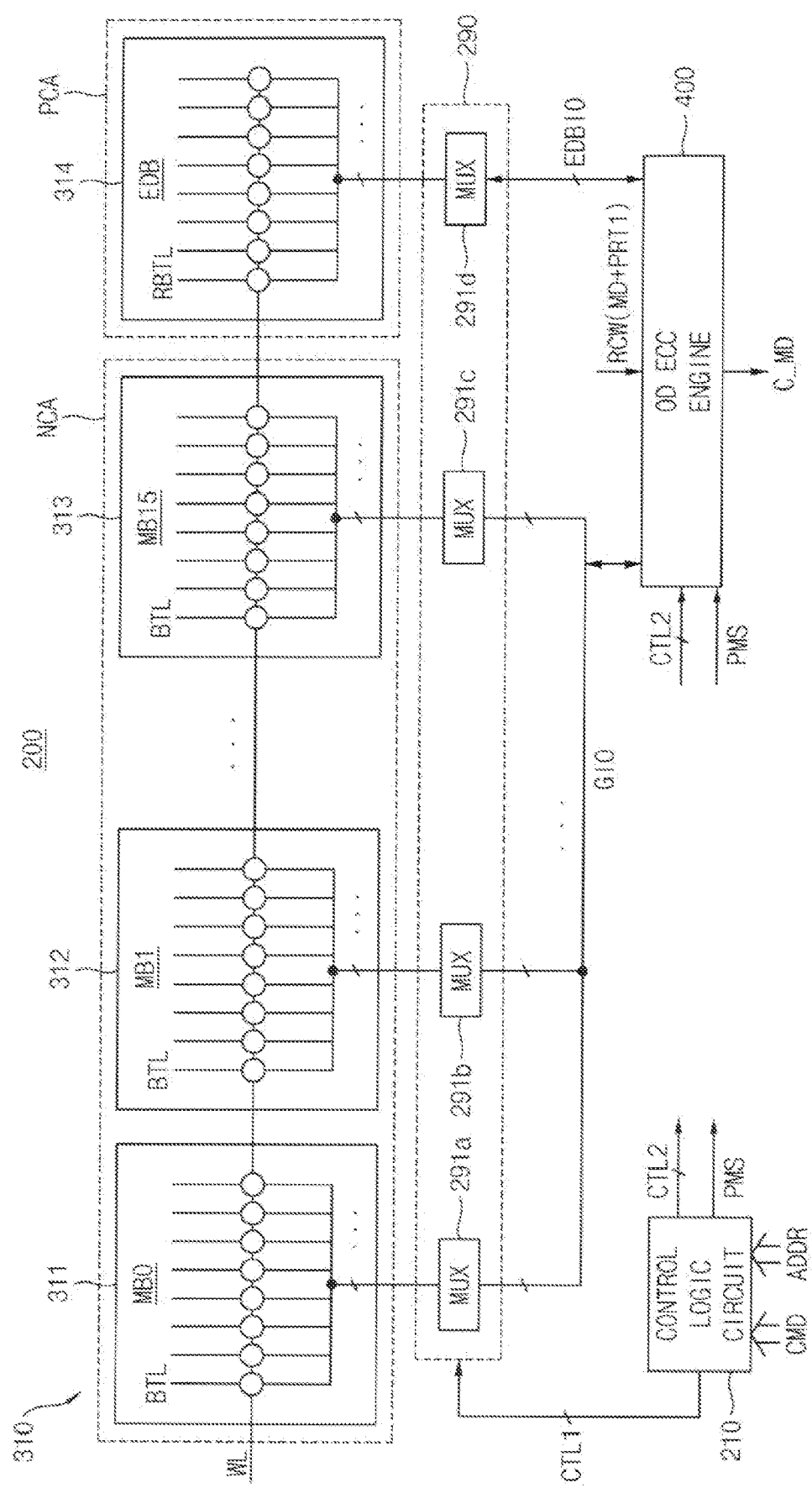
FIG. 6 illustrates a portion of the semiconductor memory device of FIG. 3 in a read operation of the normal mode.

FIG. 6 illustrates a portion of the semiconductor memory device of FIG. 3 in a read operation of the normal mode.

In FIG. 6, description of elements repeated with respect to FIG. 5 will be omitted.

Referring to FIG. 6, when the command CMD is a read command to designate a read operation and the mode register 212 in the control logic circuit is set to the normal mode, the control logic circuit 210 provides the first control signal CTL1 to the I/O gating circuit 290 such that a (read) codeword RCW stored in the target page in the first bank array 310 is provided to the on-die ECC engine 400. The codeword RCW includes the main data MD and the first parity data PRT1.

In one embodiment, the on-die ECC engine 400 performs ECC decoding operation on the read codeword RCW to correct one error bit and detect two error bits in the read codeword RCW and outputs the corrected main data C_MD.

Figure 7:
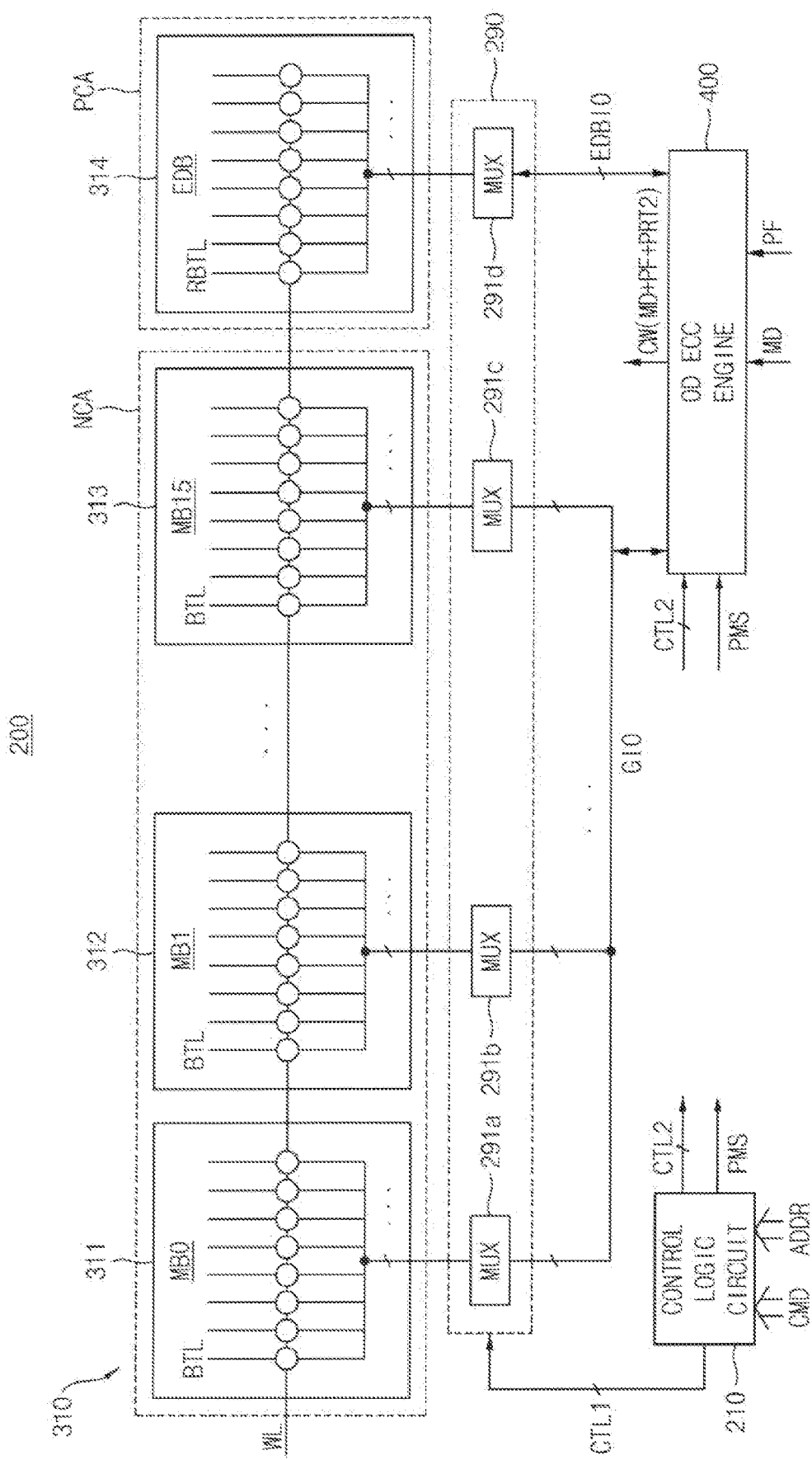
FIG. 7 illustrates a portion of the semiconductor memory device of FIG. 3 in a write operation of a poison mode.

FIG. 7 illustrates a portion of the semiconductor memory device of FIG. 3 in a write operation of a poison mode.

In FIG. 7, description of elements repeated with respect to FIG. 5 will be omitted.

Referring to FIG. 7, when the command CMD is a write command and the mode register 212 in the control logic circuit is set to the poison mode, the control logic circuit 210 provides the second control signal CTL2 and the poison mode signal PMS designating the poison mode to the on-die ECC engine 400. The on-die ECC engine 400 performs the ECC encoding on the main data MD to generate first parity data based on the second control signal CTL2 and the poison mode signal PMS, replaces a portion of the first parity data with the poison flag PF to generate second parity data PRT2, and provides the I/O gating circuit 290 with the codeword CW including the main data MD, the poison flag PF and the second parity data PRT2. The control logic circuit 210 provides the first control signal CTL1 to the I/O gating circuit 290 such that the codeword CW is to be stored in a target page in the first bank array 310. The poison flag PF and the second parity data PRT2 may be stored in the parity cell region PCA in the target page.

Figure 8:
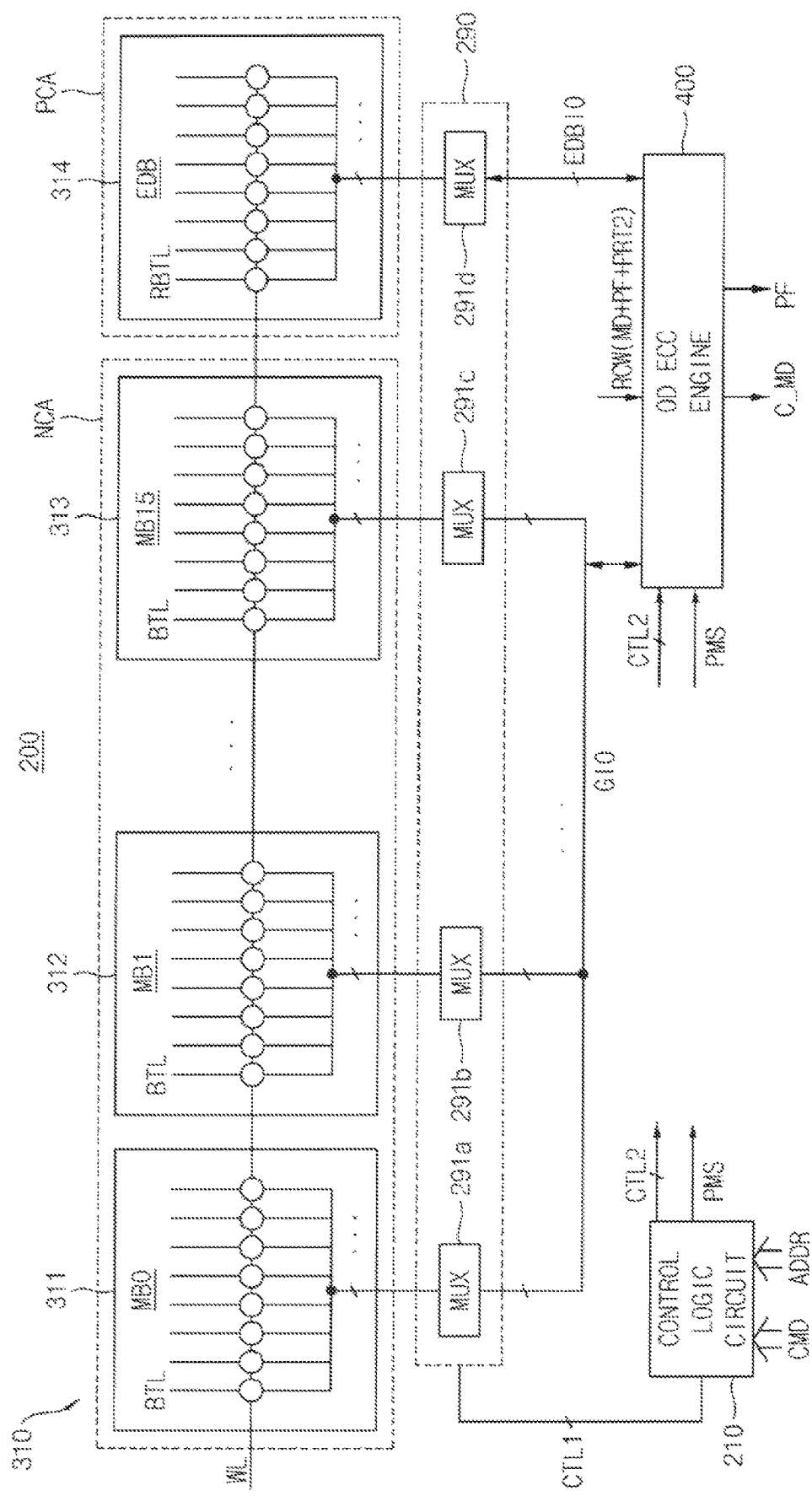
FIG. 8 illustrates a portion of the semiconductor memory device of FIG. 3 in a read operation of the poison mode.

FIG. 8 illustrates a portion of the semiconductor memory device of FIG. 3 in a read operation of the poison mode.

In FIG. 8, description of elements repeated with respect to FIG. 7 will be omitted.

Figure 10:
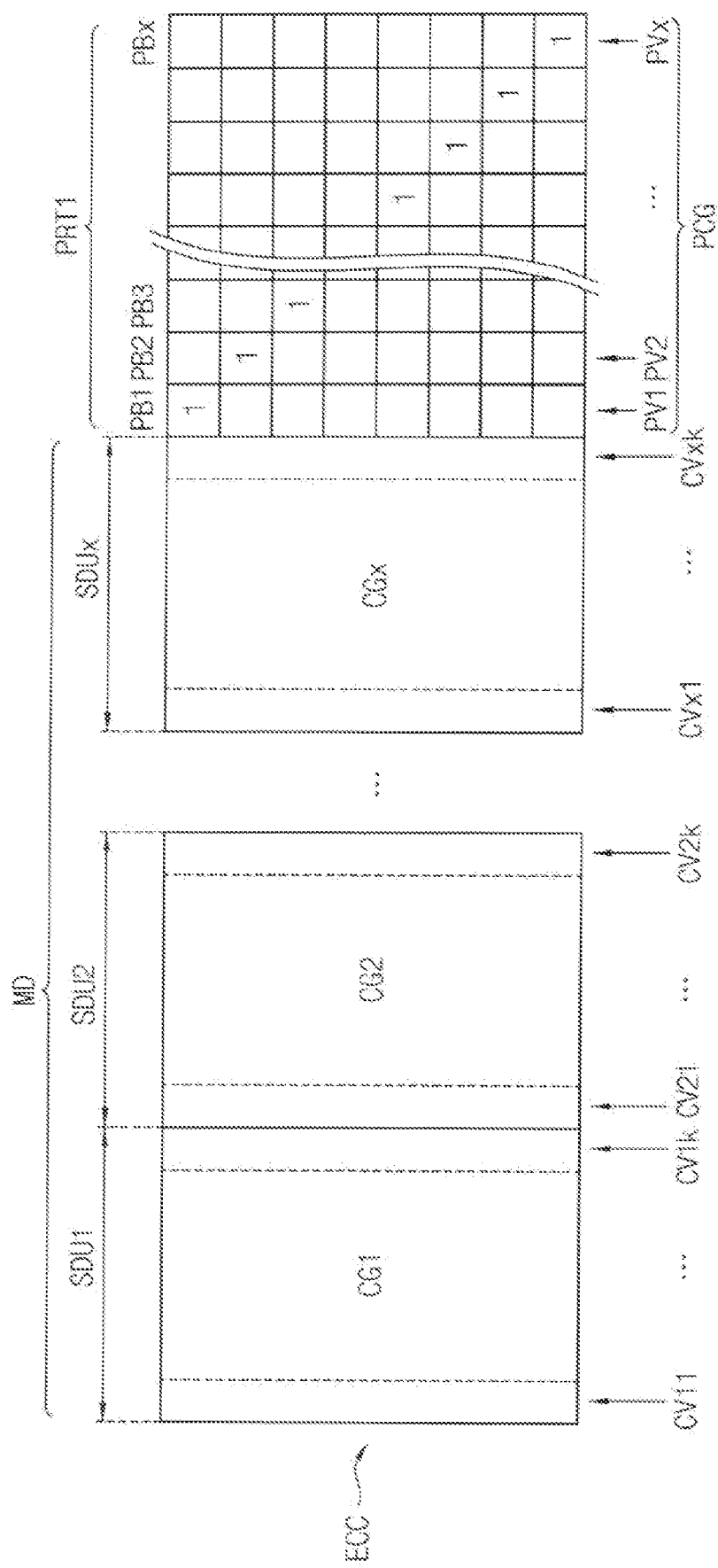
FIG. 10 illustrates relationships of the ECC and the first parity data used in on-die ECC engine of FIG. 9 according to example embodiments.

Referring to FIG. 10, when the command CMD is a read command to designate a read operation and the mode register 212 in the control logic circuit is set to the poison mode, the control logic circuit 210 provides the first control signal CTL1 to the I/O gating circuit 290 such that a (read) codeword RCW stored in the target page in the first bank array 310 is provided to the on-die ECC engine 400. The codeword RCW includes the main data MD, the poison flag PF and the second parity data PRT2.

The on-die ECC engine 400 performs ECC decoding operation on the main data MD and the poison flag PF using the second parity data PRT2 to correct one error bit in the main data MD and the poison flag PF and outputs the corrected main data C_MD and the poison flag PF.

Figure 9:
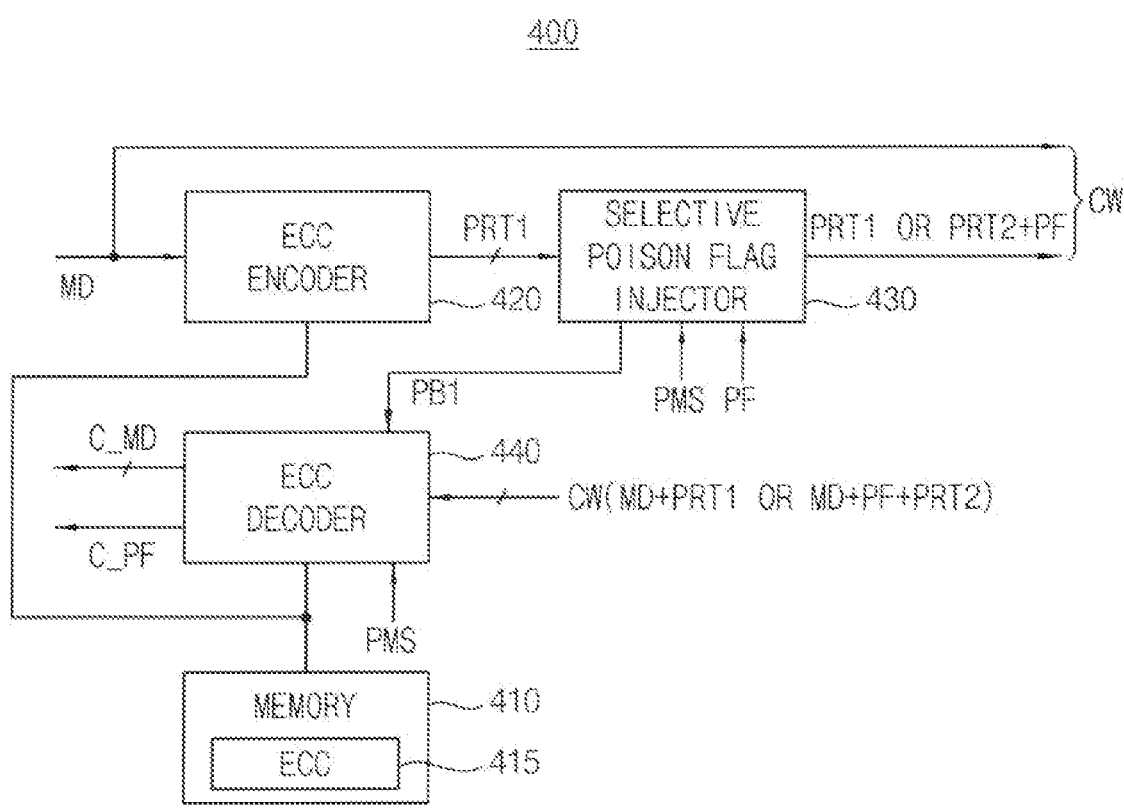
FIG. 9 is a block diagram illustrating an example of the on-die ECC engine in the semiconductor memory device of FIG. 3 according to example embodiments.

FIG. 9 is a block diagram illustrating an example of the on-die ECC engine in the semiconductor memory device of FIG. 3 according to example embodiments.

Referring to FIG. 9, the on-die ECC engine 400 may include an (ECC) memory 410, an ECC encoder 420, a selective poison flag injector 430 and an ECC decoder 440.

The ECC memory 410 stores an ECC 415. The ECC 415 may be represented by a parity check matrix (e.g., a data format/structure of the ECC 415 may be a parity check matrix) or a H matrix, and may include a plurality of column vectors corresponding to data bits in the main data (e.g., MD) and a plurality of parity vectors corresponding to parity bits in the first parity data (e.g., PRT1).

The ECC encoder 420 is connected to the ECC memory 410, and may perform ECC encoding operation on the main data MD using the ECC 415 stored in the ECC memory 410 to generate the first parity data PRT1 in a write operation of the semiconductor memory device 200. The ECC encoder 420 may provide the first parity data PRT1 to the selective poison flag injector 430.

The selective poison flag injector 430 may receive the first parity data PRT1, the poison flag PF and the poison mode signal PMS, may selectively replace a portion of bits in the first parity data PRT1 with the poison flag PF based on the poison mode signal PMS to generate the second parity data PRT2, and may output the second parity data PRT2 and the poison flag PF.

Therefore, the selective poison flag injector 430 may output the first parity data PRT1 in response to the poison mode signal PMS designating the normal mode and may output the second parity data PRT2 and the poison flag PF in response to the poison mode signal PMS designating the poison mode. Therefore, the on-die ECC engine 400 may provide the target page of the bank array with the codeword CW including the main data MD and the first parity data PRT1 in the normal mode and provide the target page of the bank array with the codeword CW including the main data MD, the second parity data PRT2 and the poison flag PF in the poison mode. The selective poison flag injector 430 may provide the ECC decoder 440 with a first parity bit PB1 that is replaced with the poison flag PF.

The ECC decoder 440 is connected to the ECC memory 410. The ECC decoder 440 may receive the codeword CW including the main data MD and the first parity data PRT1 in a read operation of the normal mode based on the poison mode signal PMS, may perform ECC decoding operation on the main data MD based on the first parity data PRT1 using the ECC 415 to correct an error bit in the main data MD and/or detect two error bits in the main data MD, and may output corrected main data C_MD.

The ECC decoder 440 may receive the codeword CW including the main data MD, the second parity data PRT2 and the poison flag PF in a read operation of the poison mode based on the poison mode signal PMS, may perform ECC decoding operation on the main data MD and the poison flag PF based on the second parity data PRT2 and the first parity bit PB1 using the ECC 415 to correct an error bit in the main data MD and the poison flag PF, and may output corrected main data C_MD and a corrected poison flag C_PF.

Although it is described with reference to FIG. 9 that the ECC memory 410 is connected to the ECC encoder 420 and the ECC decoder 440, in example embodiments, the ECC memory 410 may be implemented with XOR gates within the ECC encoder 420 and/or the ECC decoder 440.

FIG. 10 illustrates relationships of the ECC and the first parity data used in on-die ECC engine of FIG. 9 according to example embodiments.

In FIG. 10, it is assumed that the main data MD includes a plurality of sub data units SDU1~SDUx, and the first parity data PRT1 includes x-bit parity bits PB1~PBx. In FIG. 10, it is assumed that x is a natural number equal to or greater than eight.

Referring to FIG. 10, the ECC 415 may be divided into a plurality of code groups CG1~CGx and PCG corresponding to the plurality of sub data units SDU1~SDUx and the first parity data PRT1. The code group PCG may include a plurality of column vectors PV1~PVx corresponding to parity bits PB1~PBx of the first parity data PRT1.

The code group CG1 may include a plurality of column vectors CV11~CV1k (k is an integer equal to or greater than four) corresponding to data bits in the sub data unit SDU1, the code group CG2 may include a plurality of column vectors CV21~CV2k corresponding to data bits in the sub data unit SDU2, and the code group CGx may include a plurality of column vectors CVx1~CVxk corresponding to data bits in the sub data unit SDUx.

Figure 11:
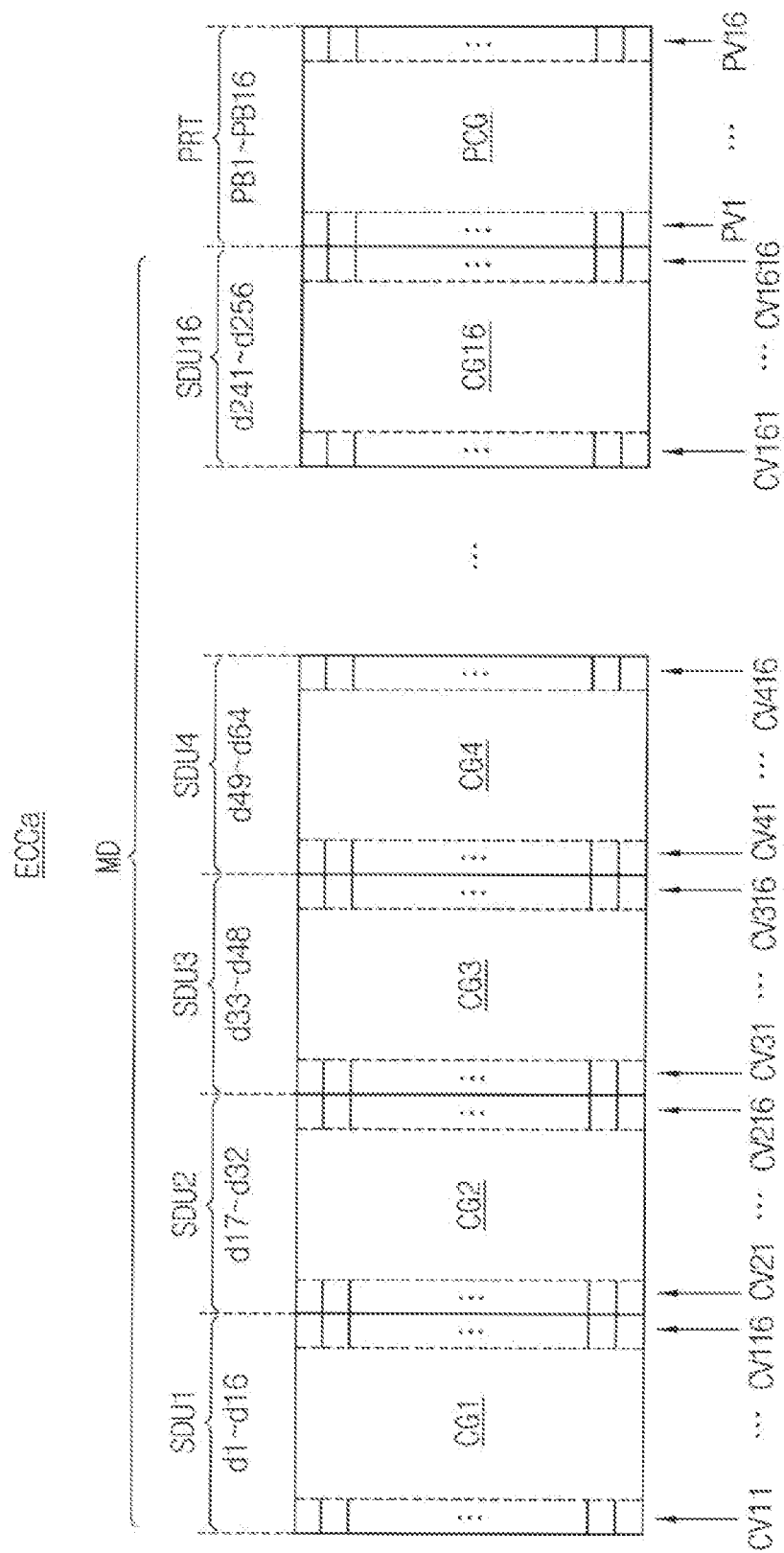
FIG. 11 illustrates an example of the ECC in FIG. 10 according to example embodiments.

FIG. 11 illustrates an example of the ECC in FIG. 10 according to example embodiments.

In FIG. 11, it is assumed that the main data MD includes 256-bit data bits d1~d256 and the first parity data PRT1 may include parity bits PB1~PB16. That is, it is assumed that x is sixteen in FIG. 10.

Referring to FIG. 11, the data bits d1~d256 of the main data MD may be divided into first through sixteenth sub data units SDU1~SDU16.

Each of the first through sixteenth sub data units SDU1~SDU16 includes 16-bit data bits. The sub data unit SDU1 includes data bits d1~d16, the sub data unit SDU2 includes data bits d17~d32, the sub data unit SDU3 includes data bits d33~d48, the sub data unit SDU4 includes data bits d49~d64, and so on, with the sub data unit SDU16 including data bits d241~d256.

An ECCa (i.e., the parity check matrix) includes first through sixteenth code groups CG1~CG16 corresponding to the first through sixteenth sub data units SDU1~SDU16 and the code group PCG corresponding to the parity bits PB1~PB16.

The first through sixteenth code groups CG1~CG16 include column vectors CV11~CV116, CV211~CV216, CV31~CV316, CV41~CV416, . . . , CV161~CV1616 and the code group PCG includes column vectors PV1-PV16.

FIG. 12 illustrates that the on-die ECC engine modifies an ECC used in the normal mode to provide a modified ECC used in the poison mode.

In FIG. 12, it is illustrated as an example for convenience of explanation that the on-die ECC engine 400 modifies a (7, 5) single error correction/double error detection (SECDED) code ECCb used in the normal mode to provide a modified (8, 4) single error correction (SEC) code ECCb_M used in the poison mode.

Referring to FIG. 12, the (7, 5) SECDED code ECCb may include column vectors CV1, CV2, CV3, CV4, CV5, CV6 and CV7 corresponding to data bits d1, d2, d3, d4, d5, d6 and d7 and parity vectors PV1, PV2, PV3, PV4 and PV5 corresponding to parity bits PB1, PB2, PB3, PB4 and PB5.

Each of the column vectors CV1, CV2, CV3, CV4, CV5, CV6 and CV7 may include odd number of elements having a first logic level (a logic high level) and the (7, 5) SECDED code ECCb corresponds to an odd parity.

The ECC encoder 420 in FIG. 9, in the normal mode, performs an ECC encoding operation on the data bits d1, d2, d3, d4, d5, d6 and d7 using the (7, 5) SECDED code ECCb to generate the parity bits PB1, PB2, PB3, PB4 and PB5 and performs an ECC decoding operation on the data bits d1, d2, d3, d4, d5, d6 and d7 based on the parity bits PB1, PB2, PB3, PB4 and PB5 using the (7, 5) SECDED code ECCb to correct one error bit and detect two error bits in the data bits d1, d2, d3, d4, d5, d6 and d7.

When the mode register 212 is set to the poison mode, the control logic circuit 210 in FIG. 3 may don't care process a first row associated with the first parity bit PB1 among a plurality of rows of the SECDED code ECCb to be replaced with the poison flag PF. The control logic circuit 210 in FIG. 3 may also change elements of the first parity vector PV1 associated with the first parity bit PB1 such that the changed elements of the first parity vector PV1 are not overlapped with elements of each of the column vectors CV1, CV2, CV3, CV4, CV5, CV6 and CV7 and elements of each of the parity vectors PB2, PB3, PB4 and PB5 to generate a modified (8, 4) SEC code ECCb_M including the changed parity vector PV1'. The parity vectors PB2, PB3, PB4 and PB5 (the parity vectors except the first parity vector PV1) may be referred to as second parity vectors.

The ECC encoder 420 in FIG. 9, in the poison mode, performs an ECC encoding operation on the data bits d1, d2, d3, d4, d5, d6 and d7 and the poison flag PF using the modified SEC code ECCb_M to generate the parity bits PB2, PB3, PB4 and PB5 and performs an ECC decoding operation on the data bits d1, d2, d3, d4, d5, d6 and d7 based on the parity bits PB2, PB3, PB4 and PB5 using the modified SEC code ECCb_M to correct one error bit in the data bits d1, d2, d3, d4, d5, d6 and d7 and the poison flag PF.

Figure 13:
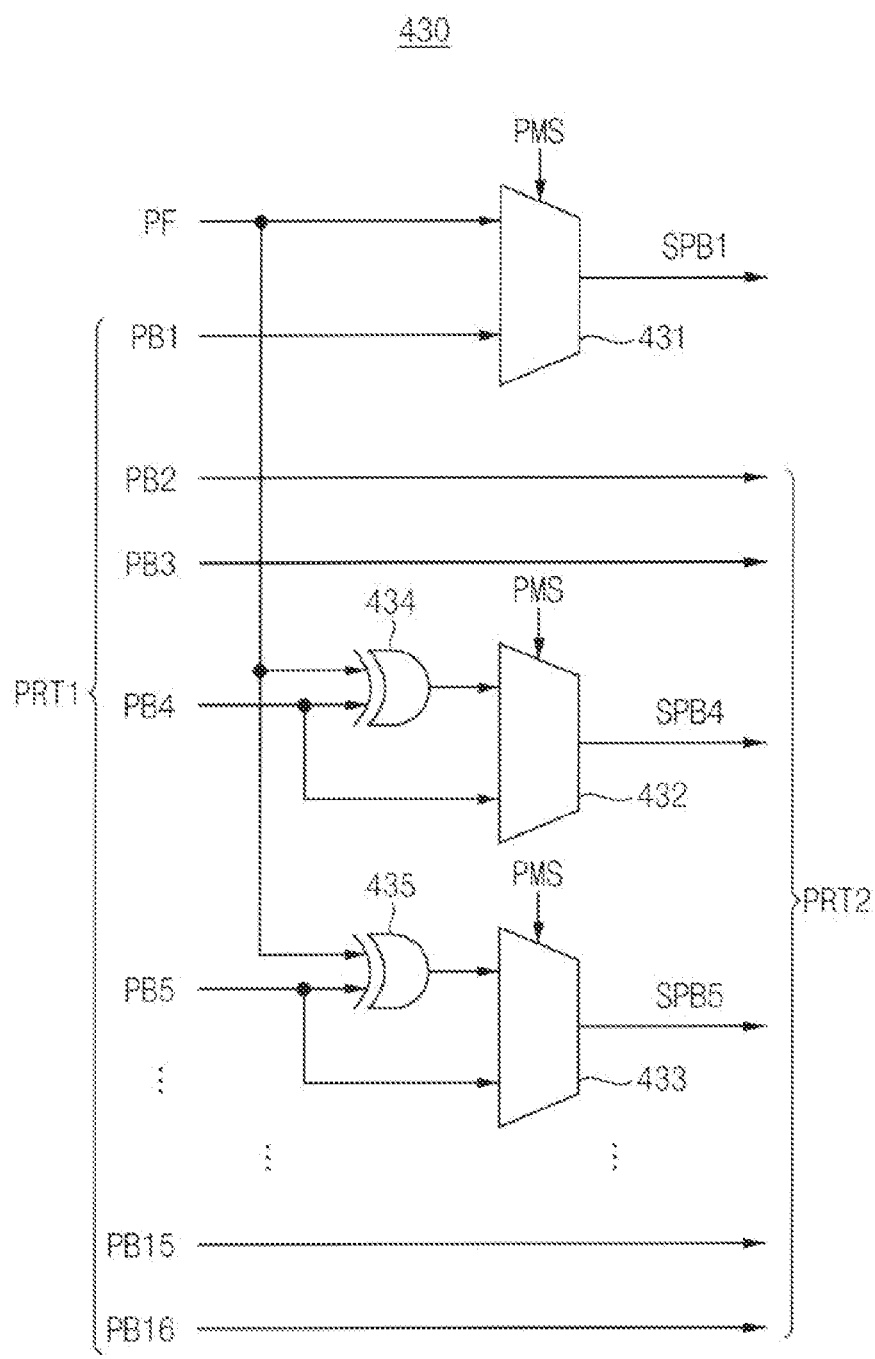
FIG. 13 is a circuit diagram illustrating an example of the selective poison flag injector in the on-die ECC engine of FIG. 9 according to example embodiments.

FIG. 13 is a circuit diagram illustrating an example of the selective poison flag injector in the on-die ECC engine of FIG. 9 according to example embodiments.

In FIG. 13, it is assumed that the main data MD in FIG. 9 includes 256 bits and the first parity data PRT1 includes 16-bit parity bits PB1~PB16.

Referring to FIG. 13, the selective poison flag injector 430 may include a plurality of multiplexers 431, 432 and 433 and a plurality of XOR gates 434 and 435.

The multiplexer 431 may output one of the first parity bit PB1 and the poison flag PF to replace the first parity bit PB1 as a selected bit SPB1 in response to the poison mode signal PMS.

The XOR gate 434 may perform an XOR operation on the poison flag PF and the parity bit PB4 associated with a changed parity vector and the multiplexer 432 may output one of an output of the XOR gate 434 and the parity bit PB4 as a selected bit SPB4 in response to the poison mode signal PMS.

The XOR gate 435 may perform an XOR operation on the poison flag PF and the parity bit PB5 associated with the changed parity vector and the multiplexer 433 may output one of an output of the XOR gate 435 and the parity bit PB5 as a selected bit SPB5 in response to the poison mode signal PMS.

In response to the poison mode signal PMS designating the normal mode, the multiplexer 431 outputs the first parity bit PB1, the multiplexer 432 outputs the parity bit PB4, the multiplexer 433 outputs the parity bit PB5, and thus the selective poison flag injector 430 outputs the first parity data PRT1 in the normal mode.

In response to the poison mode signal PMS designating the poison mode, the multiplexer 431 outputs the poison flag PF, the multiplexer 432 outputs the output of the XOR gate 434, the multiplexer 433 outputs the output of XOR gate 435, and thus the selective poison flag injector 430 outputs the second parity data PRT2 which includes the poison flag PF and in which logic levels of the parity bits PB4 and PB5 are selectively inverted based on a logic level of the poison flag PF, in the poison mode.

That is, the selective poison flag injector 430, in the poison mode, may replace the first parity bit PB1 with the poison flag PF and may replace second parity bits PB4 and PB5 associated with the changed first parity vector PV1' among the plurality of parity vectors with a result of performing an XOR operation on each of the second parity bits PB4 and PB5 and the poison flag PF.

The selective poison flag injector 430 may provide the first parity bit PB1 to the ECC decoder 440.

Figure 14:
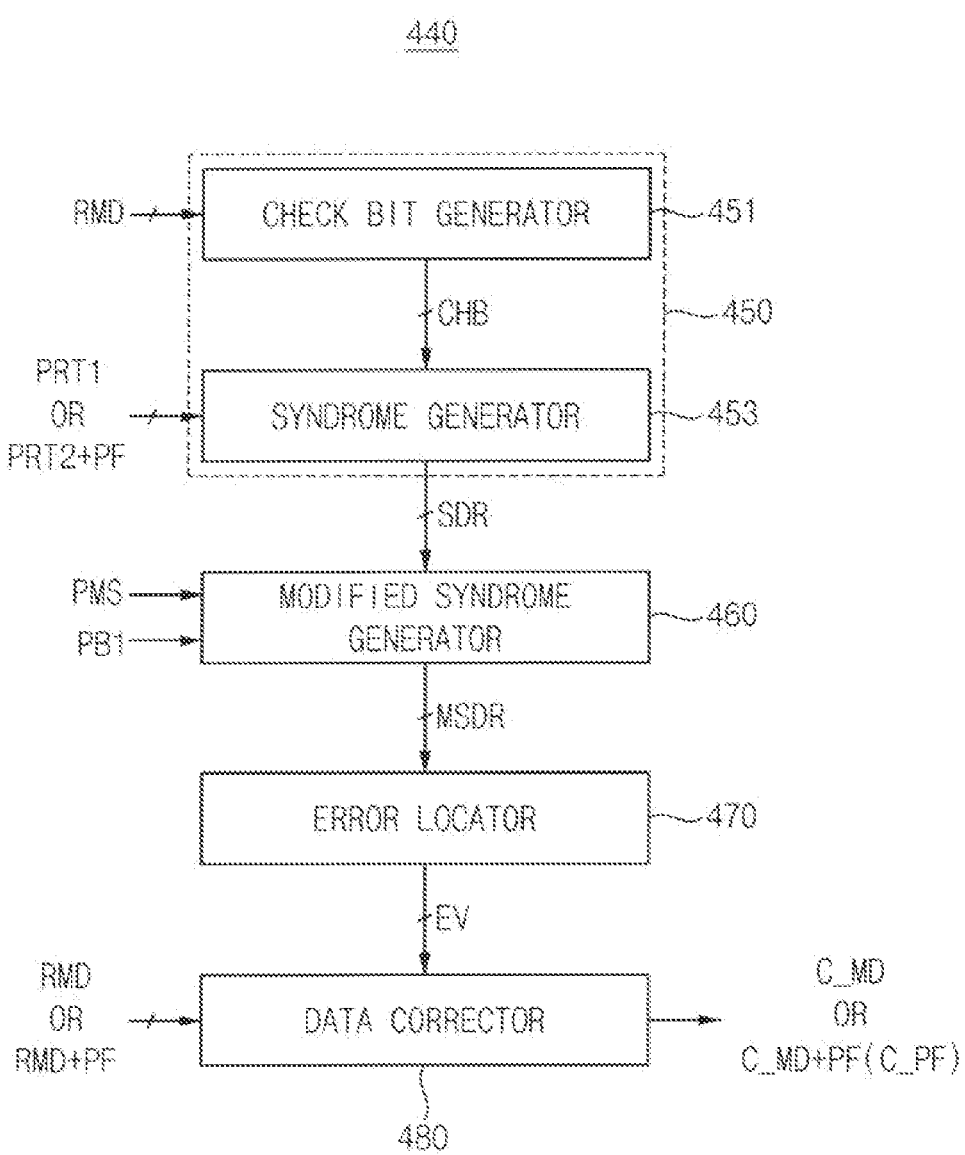
FIG. 14 illustrates an example of the ECC decoder in the on-die ECC engine of FIG. 9 according to example embodiments.

FIG. 14 illustrates an example of the ECC decoder in the on-die ECC engine of FIG. 9 according to example embodiments.

Referring to FIG. 14, the ECC decoder 440 may include a syndrome generation circuit 450, and modified syndrome generator 460, an error locator 470 and a data corrector 480.

The syndrome generation circuit 450 may include a check bit generator 451 and a syndrome generator 453.

The check bit generator 451 generates check bits CHB based on a read main data RMD by performing an XOR array operation and the syndrome generator 453 generates a syndrome SDR by comparing corresponding bits of the check bits CHB and the first parity data PRT1 or the second parity data PRT2 and the poison flag PF.

The modified syndrome generator 460 may generate a modified syndrome MSDR by selectively replacing a portion of syndrome bits of the syndrome SDR with the first parity bit PB1 based on the poison mode signal PMS. The modified syndrome generator 460 may generate the modified syndrome MSDR by maintaining the syndrome bits of the syndrome SDR in the normal mode and by replacing the portion of syndrome bits of the syndrome SDR with the first parity bit PB1 in the poison mode.

The error locator 470 may detect an error in the read main data RMD or detect an error in the read main data RMD and the poison flag PF based on the modified syndrome MSDR and may output an error vector EV indicating a position of the detected error.

The data corrector 480 may receive the read main data RMD, may correct one error bit and/or detect two error bit in the read main data RMD based on the error vector EV and may output the corrected main data C_MD, in the normal mode. The data corrector 480 may receive the read main data RMD and the poison flag PF, may correct one error bit in the read main data RMD and the poison flag PF based on the error vector EV and may output the corrected main data C_MD and the poison flag PF or the corrected main data C_MD and the corrected poison flag C_PF in the poison mode.

Figure 15:
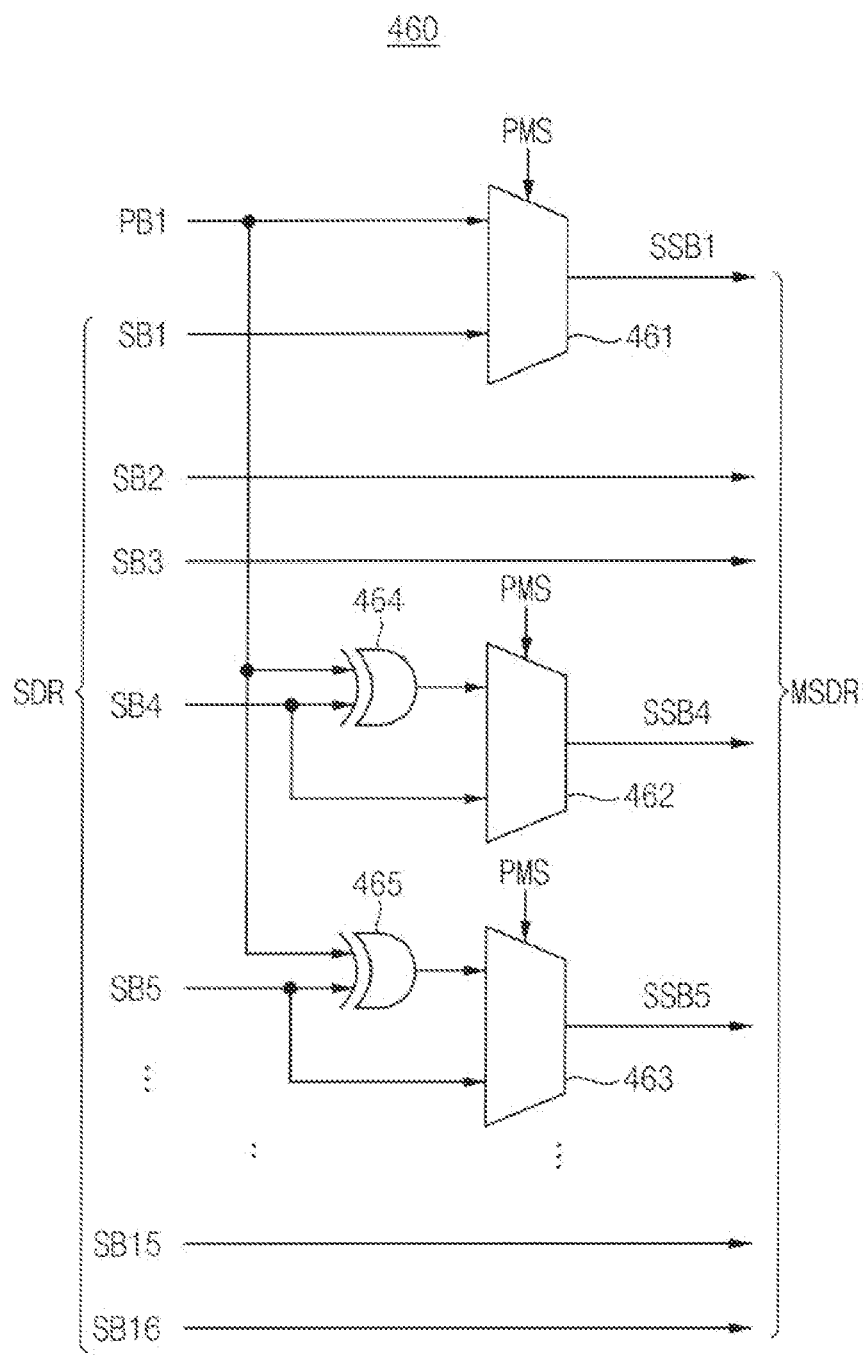
FIG. 15 is a circuit diagram illustrating an example of the modified syndrome generator in the ECC decoder of FIG. 14 according to example embodiments.

FIG. 15 is a circuit diagram illustrating an example of the modified syndrome generator in the ECC decoder of FIG. 14 according to example embodiments.

In FIG. 15, it is assumed that the main data MD in FIG. 9 includes 256 bits and the syndrome SDR in FIG. 14 includes 16-bit syndrome bits SB1~SB16.

Referring to FIG. 15, the modified syndrome generator 460 may include a plurality of multiplexers 461, 462 and 463 and a plurality of XOR gates 464 and 465.

The multiplexer 461 may output one of a first syndrome bit SB1 and the first parity bit PB1 to replace the first syndrome bit SB1 as a selected bit SSB1 in response to the poison mode signal PMS.

The XOR gate 464 may perform an XOR operation on the first parity bit PB1 and the syndrome bit SB4 associated with a changed parity vector and the multiplexer 462 may output one of an output of the XOR gate 464 and the syndrome bit SB4 as a selected bit SSB4 in response to the poison mode signal PMS.

The XOR gate 465 may perform an XOR operation on the first parity bit PB1 and the syndrome bit SB5 associated with the changed parity vector and the multiplexer 463 may output one of an output of the XOR gate 465 and the syndrome bit SB5 as a selected bit SSB5 in response to the poison mode signal PMS.

In response to the poison mode signal PMS designating the normal mode, the multiplexer 461 outputs the first syndrome bit SB1, the multiplexer 462 outputs the syndrome bit SB4, the multiplexer 463 outputs the syndrome parity bit SB5, and thus, the modified syndrome generator 460 outputs the syndrome SDR as the modified syndrome MSDR in the normal mode.

In response to the poison mode signal PMS designating the poison mode, the multiplexer 461 outputs the first parity bit PB1, the multiplexer 462 outputs the output of the XOR gate 464, the multiplexer 463 outputs the output of XOR gate 465, and thus the modified syndrome generator 460 outputs the modified syndrome MSDR which includes the first parity bit PB1 and in which logic levels of the syndrome bits SB4 and SB5 are selectively inverted based on a logic level of the first parity bit PB1, in the poison mode.

That is, the modified syndrome generator 460, in the poison mode, may replace the first syndrome bit SB1 with the first parity bit PB1 and may replace second syndrome bits SB4 and SB5 associated with the changed first parity vector PV1', among the plurality of parity vectors with a result of performing an XOR operation on each of the second syndrome bits SB4 and SB5 and the first parity bit PB1.

Figure 16:
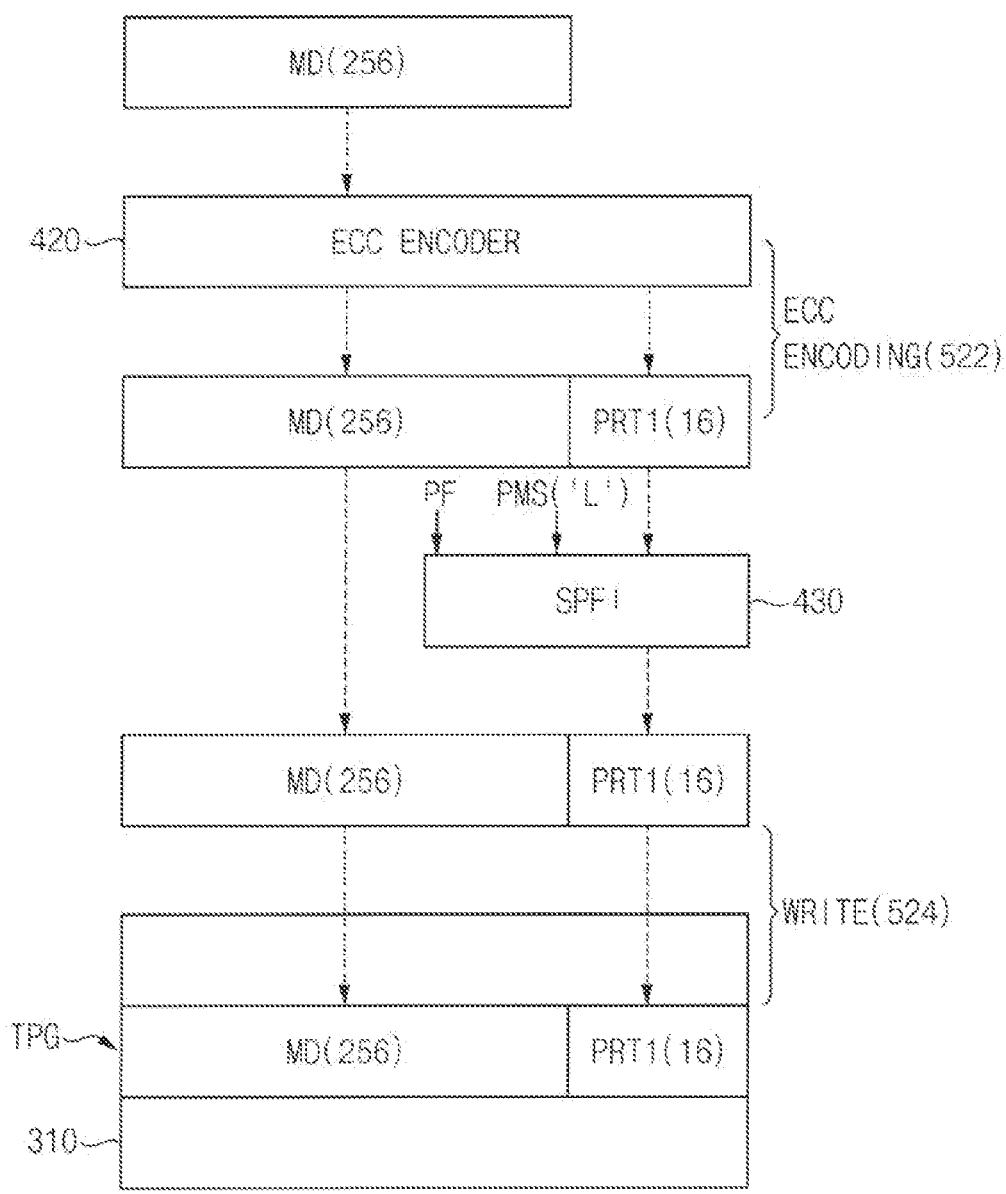
FIG. 16 illustrates that the semiconductor memory device of FIG. 3 performs a write operation in a normal mode.

FIG. 16 illustrates that the semiconductor memory device of FIG. 3 performs a write operation in a normal mode.

Referring to FIGS. 3, 9 and 16, when the command CMD is a write command and the mode register 212 is set to the normal mode, the ECC encoder 420 performs an ECC encoding on the main data MD to generate the first parity data PRT1 as a reference numeral 522 indicates and provides the first parity data PRT1 to the selective poison flag injector (SPFI) 430.

Because the poison mode signal PMS has a second logic level (a logic low level, as indicated by the reference PMS ('L')) in response to the normal mode, the selective poison flag injector 430 maintains the first parity data PRT1 and the I/O gating circuit 290 writes the main data MD and the first parity data PRT1 in a target page TPG in the first bank array 310 as a reference numeral 524 indicates.

Figure 17:
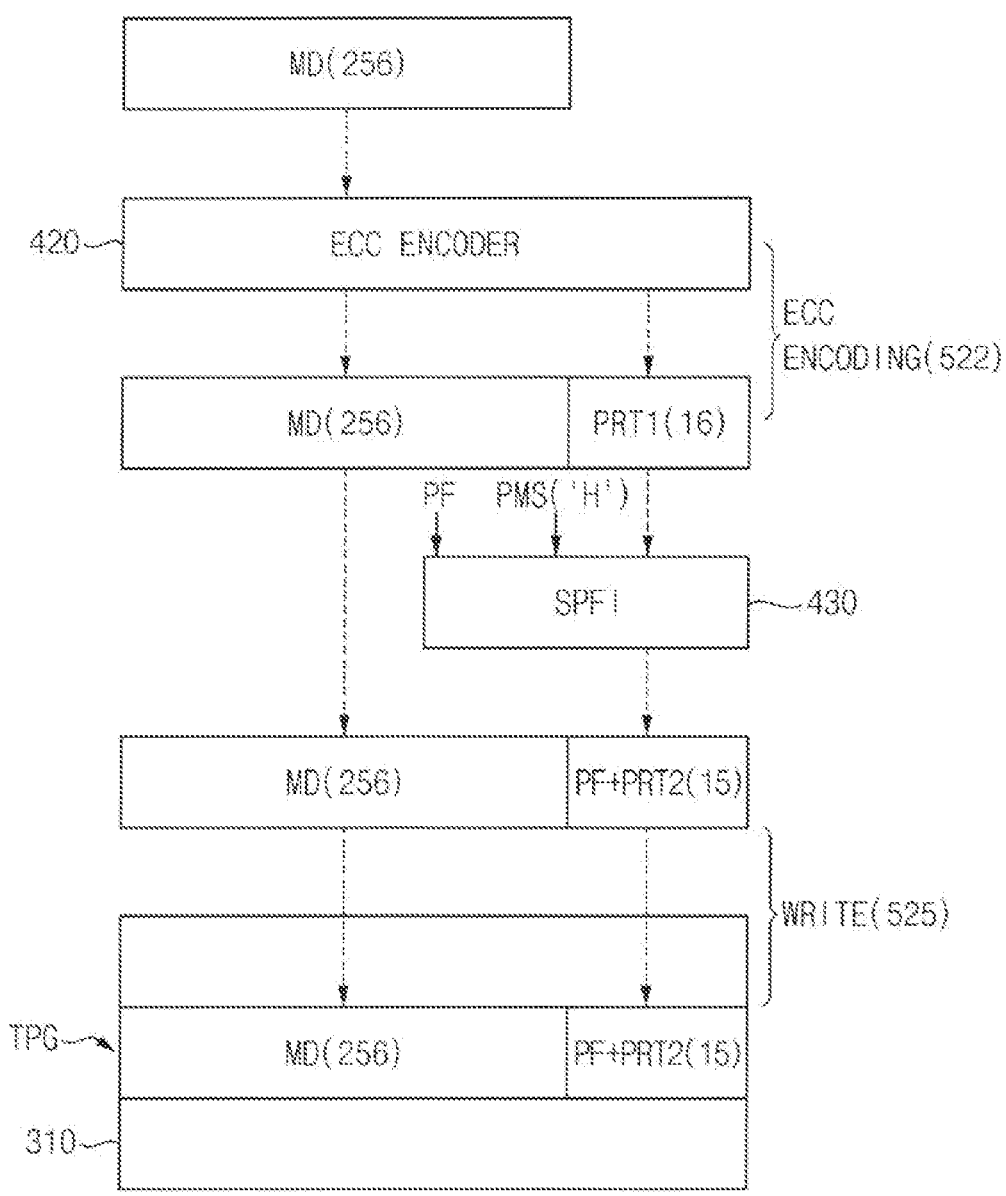
FIG. 17 illustrates that the semiconductor memory device of FIG. 3 performs a write operation in a normal mode.

FIG. 17 illustrates that the semiconductor memory device of FIG. 3 performs a write operation in a normal mode.

Referring to FIGS. 3, 9 and 17, when the command CMD is a write command and the mode register 212 is set to the poison mode, the ECC encoder 420 performs an ECC encoding on the main data MD to generate the first parity data PRT1 as a reference numeral 522 indicates and provides the first parity data PRT1 to the selective poison flag injector 430.

Because the poison mode signal PMS has a first logic level (a logic high level, as indicated by the reference PMS ('H')) in response to the poison mode, the selective poison flag injector 430 replaces a portion of the first parity data PRT1 with the poison flag PF to output the second parity data PRT2 and the poison flag PF. The I/O gating circuit 290 writes the main data MD and the second parity data PRT2 and the poison flag PF in a target page TPG in the first bank array 310 as a reference numeral 525 indicates. The first parity data PRT1 may include 16 bits and the second parity data PRT2 may include 15 bits.

Figure 18:
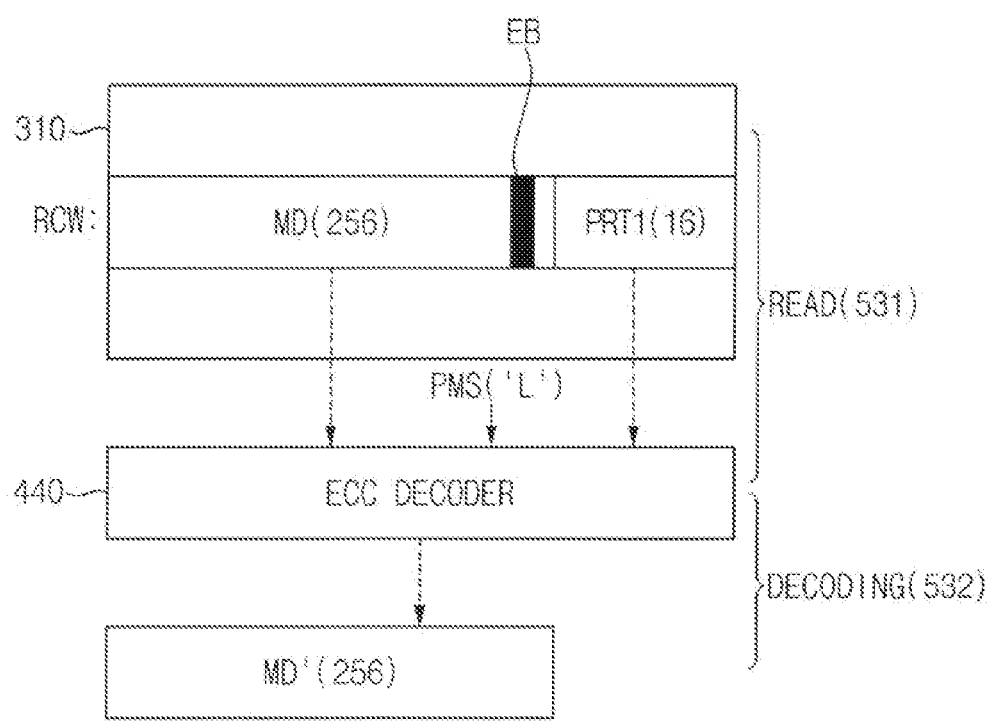
FIG. 18 illustrates that the semiconductor memory device of FIG. 3 performs a read operation in a normal mode.

FIG. 18 illustrates that the semiconductor memory device of FIG. 3 performs a read operation in a normal mode.

Referring to FIGS. 3, 9 and 18, when the command CMD is a write command and the mode register 212 is set to the normal mode (as indicated by the reference PMS ('L'), the ECC decoder 440 reads a codeword RCW including the main data MD and the first parity data PRT1 from a target page in the first bank array 310 as a reference numeral 531 indicates, performs an ECC decoding on the main data MD based on the first parity data PRT1, corrects an error bit EB in the main data MD, and outputs a corrected main data MD' as a reference numeral 532 indicates.

Figure 19:
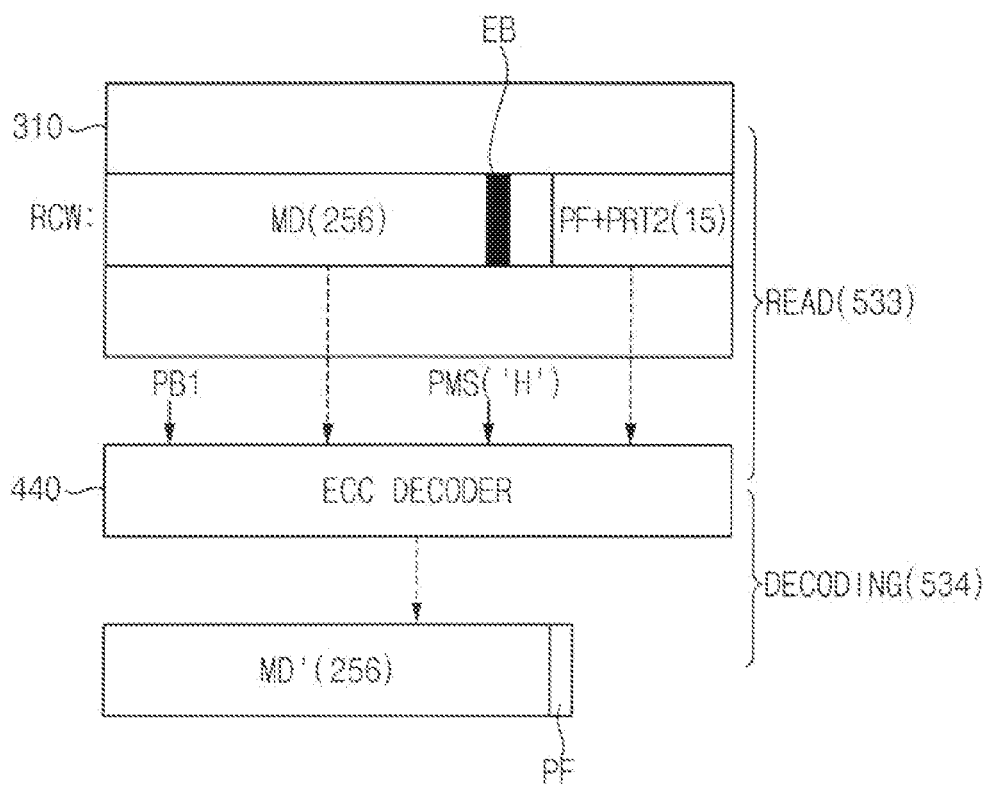
FIG. 19 illustrates that the semiconductor memory device of FIG. 3 performs a read operation in a normal mode.

FIG. 19 illustrates that the semiconductor memory device of FIG. 3 performs a read operation in a normal mode.

Referring to FIGS. 3, 9 and 19, when the command CMD is a write command and the mode register 212 is set to the poison mode (as indicated by the reference PMS ('H'), the ECC decoder 440 reads a codeword RCW including the main data MD, the second parity data PRT2 and the poison flag PF from a target page in the first bank array 310 as a reference numeral 533 indicates, performs an ECC decoding operation on the main data MD and the poison flag PF based on the second parity data PRT2, corrects an error bit EB in the main data MD, and outputs a corrected main data MD' and the poison flag PF as a reference numeral 534 indicates. The ECC decoder 440 performs an ECC decoding operation by using the poison flag PF and the first parity bit PB1 that is replaced.

Figure 20:
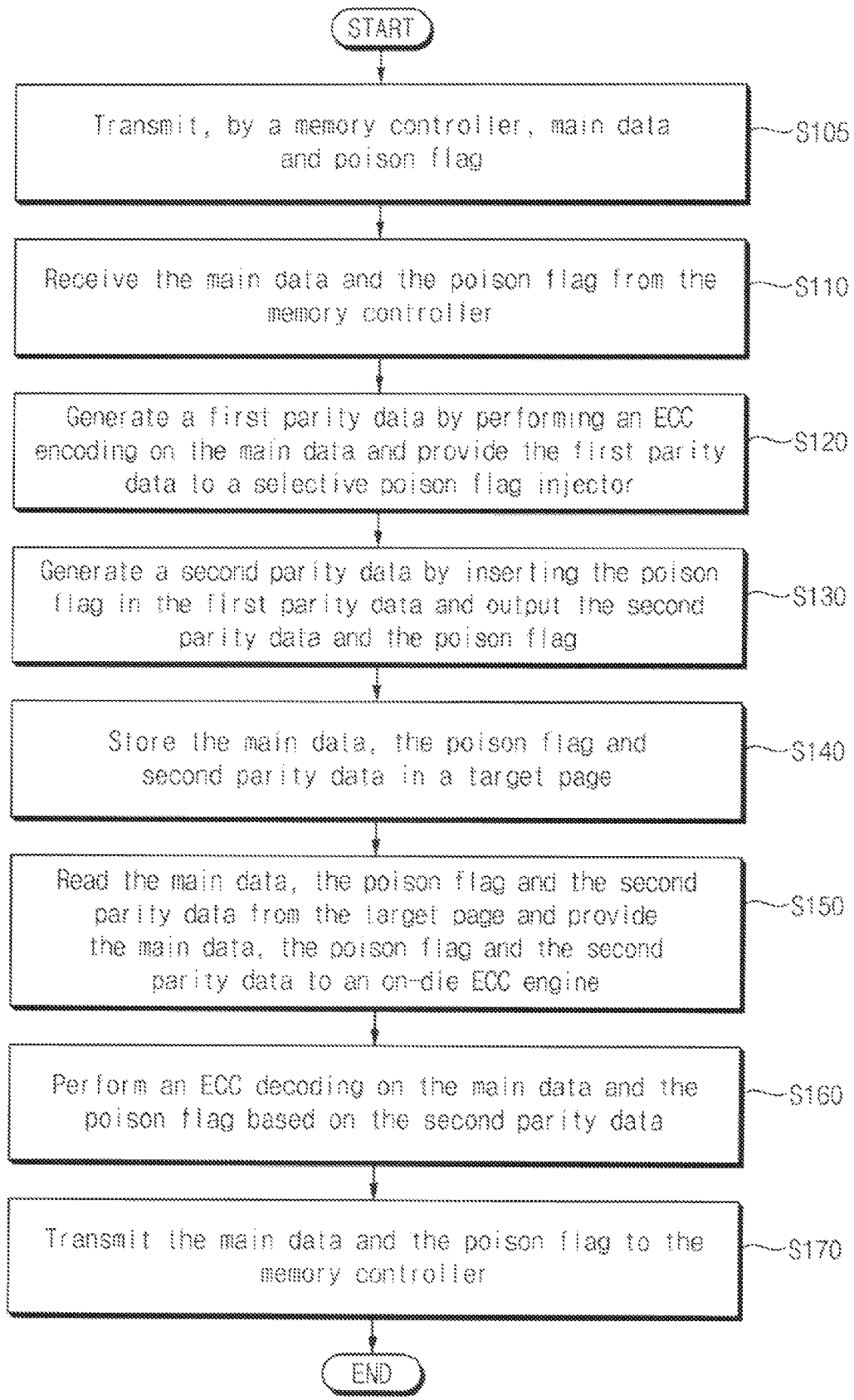
FIG. 20 is a flow chart illustrating a method of operating a semiconductor memory device.
Figure 21:
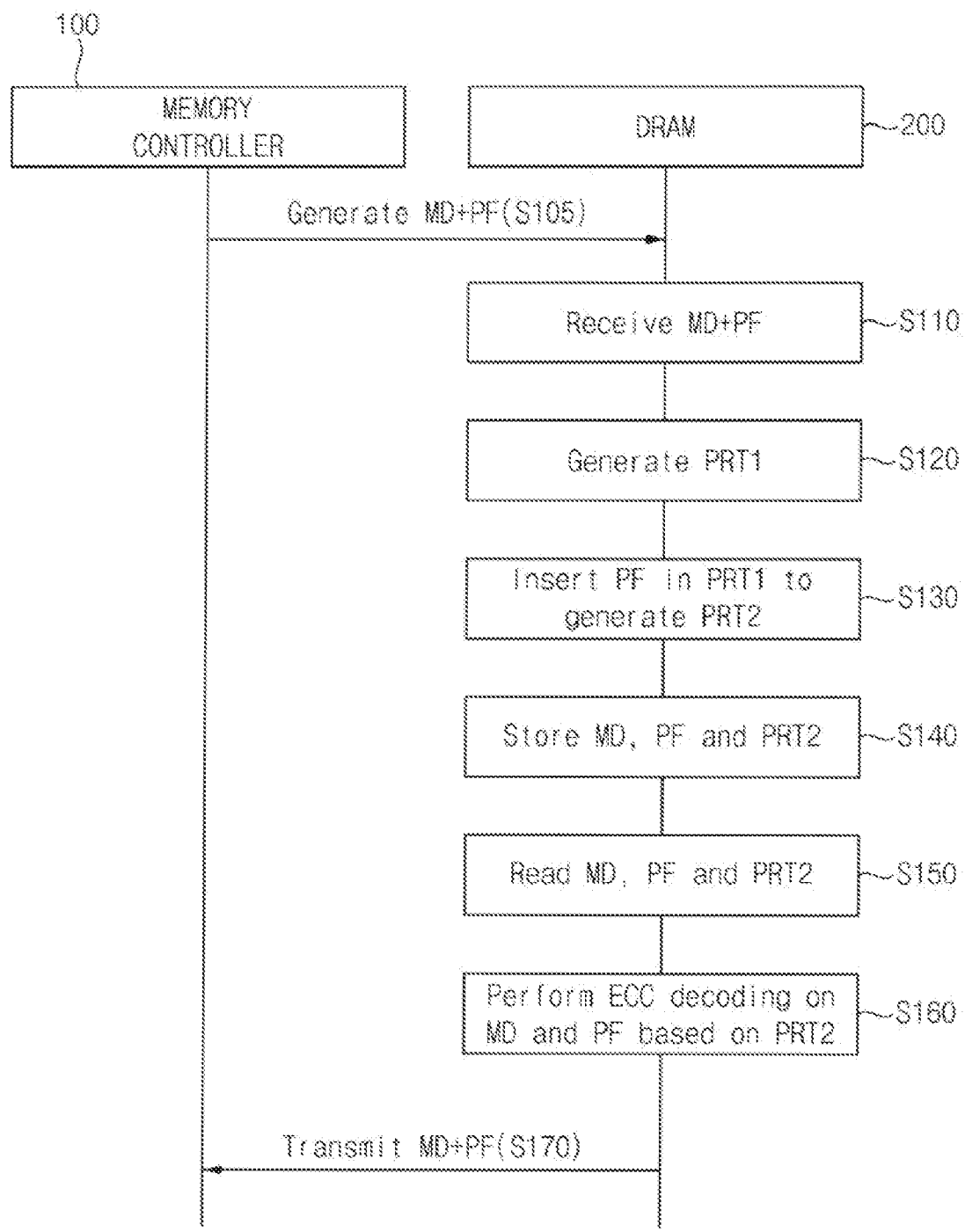
FIG. 21 is a sequence chart illustrating a method of operating a semiconductor memory device.

FIG. 20 is a flow chart illustrating a method of operating a semiconductor memory device and FIG. 21 is a sequence chart illustrating a method of operating a semiconductor memory device.

In FIGS. 20 and 21, it is assumed that the mode register 212 in the control logic circuit 210 is set to the poison mode.

Referring to FIGS. 1 through 21, the memory controller 100 transmits the main data MD and the poison flag PF to the semiconductor memory device 200 (DRAM) (operation S105), and the semiconductor memory device 200 receives the main data MD and the poison flag PF (operation S110). The poison flag PF may indicate whether the main data MD correspond to poisoned data.

The on-die ECC engine 400 performs an ECC encoding operation on the main data MD to generate the first parity data PRT1 (operation S120), and provides the first parity data PRT1 to the selective poison flag injector 430.

In response to the poison mode signal PMS having a first logic level, the selective poison flag injector 430 replaces a portion of the first parity data PRT1 with the poison flag PF to generate the second parity data PRT2 (operation S130), and outputs the second parity data PRT2 and the poison flag PF.

The I/O gating circuit 290 stores the main data MD, the poison flag PF, and the second parity data PRT2 in a target page (operation S140).

The I/O gating circuit 290 reads the main data MD, the poison flag PF and the second parity data PRT2 from the target page based on a read command from the memory controller (operation S150) and provides the main data MD, the poison flag PF and the second parity data PRT2 to the on-die ECC engine 400.

The on-die ECC engine 400 performs an ECC decoding operation on the main data MD and the poison flag PF based on the second parity data PRT2 to correct an error bit in the main data MD and the poison flag PF (operation S160).

The semiconductor memory device 200 transmits the main data MD and the poison flag PF to the memory controller (operation S170).

Accordingly, in the semiconductor memory device and the memory system according to example embodiments, the on-die ECC engine performs an ECC encoding on the main data to generate the first parity data using an ECC, replaces a portion of the first parity data with the poison flag to generate the second parity data in the poison mode, stores the poison flag and the second parity data in a parity cell region, and performs an ECC decoding operation on the main data and the poison flag based on the second parity data to protect the poison flag. That is, the semiconductor memory device may store the poison flag as meta data in the parity cell region without size overhead and the on-die ECC engine may perform the ECC encoding operation based on the ECC which is used as a different code in the normal mode and the poison mode based on the poison mode signal. That is, a different code is used in normal code for the ECC encoding operation as compared to the code used if in poison mode.

Figure 22:
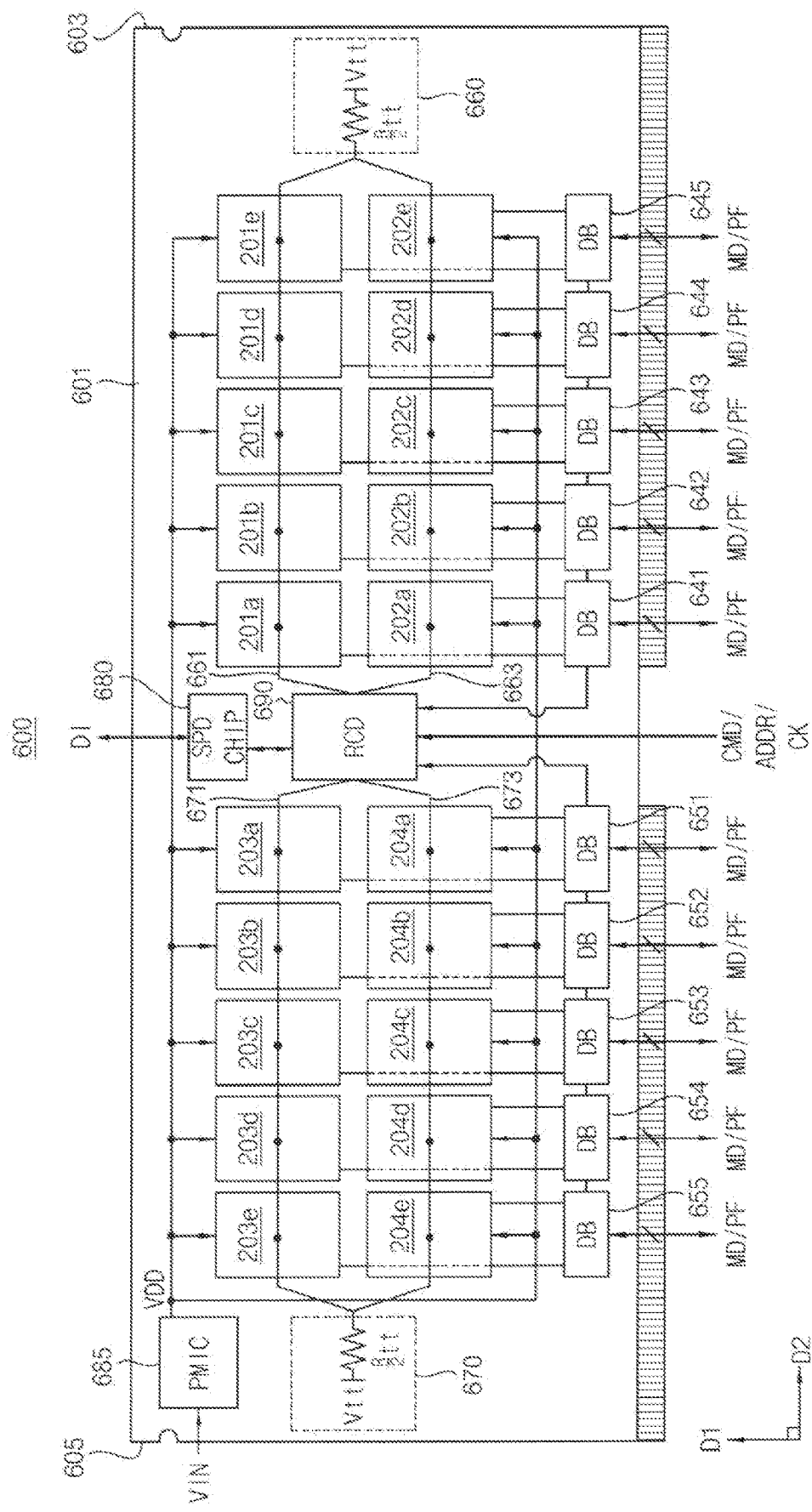
FIG. 22 is a block diagram illustrating an example of memory module according to example embodiments.

FIG. 22 is a block diagram illustrating an example of memory module according to example embodiments.

Referring to FIG. 22, a memory module 600 includes a register clock driver (RCD) 690 disposed (or mounted) in a circuit board 601, a plurality of semiconductor memory devices 201a~201e, 202a~202e, 203a~203e, and 204a~204e, a plurality of data buffers 641~645 and 651~655, module resistance units 660 and 670, a serial presence detection (SPD) chip 680, and a power management integrated circuit (PMIC) 685.

Here, the circuit board 601, which may be a printed circuit board, may extend in a second direction D2, perpendicular to a first direction D1, between a first edge portion 603 and a second edge portion 605. The first edge portion 603 and the second edge portion 605 may extend in the first direction D1.

The RCD 690 may be on or near a center of the circuit board 601. The plurality of semiconductor memory devices 201a~201e, 202a~202e, 203a~203e, and 204a~204e may be arranged in a plurality of rows between the RCD 690 and the first edge portion 603 and between the RCD 690 and the second edge portion 605.

In this case, the semiconductor memory devices 201a~201e and 202a~202e may be arranged along a plurality of rows between the RCD 690 and the first edge portion 103. The semiconductor memory devices 203a~203e, and 204a~204e may be arranged along a plurality of rows between the RCD 690 and the second edge portion 105. A portion of the semiconductor memory devices 201a~201e and 202a~202e may be an error correction code (ECC) memory device. The ECC memory device may perform an ECC encoding operation to generate parity bits about data to be written at memory cells of the plurality of semiconductor memory devices 201a~201e, 202a~202e, 203a~203e, and 204a~204e, and an ECC decoding operation to correct an error occurring in the data read from the memory cells.

Each of the plurality of semiconductor memory devices 201a~201e, 202a~202e, 203a~203e, and 204a~204e may be coupled to a corresponding one of the data buffers 141~145 and 151~155 through a data transmission line for receiving/transmitting main data MD and a poison flag PF. The poison flag PF may have a corresponding level and may indicate whether the main data MD which each of the plurality of semiconductor memory devices 201a~201e, 202a~202e, 203a~203e, and 204a~204e receives corresponds to poisoned data.

Each of the plurality of semiconductor memory devices 201a~201e, 202a~202e, 203a~203e, and 204a~204e may employ the semiconductor memory device of FIG. 3. Therefore, each of the plurality of semiconductor memory devices 201a~201e, 202a~202e, 203a~203e, and 204a~204e may include a memory cell array, a control logic circuit and an on-die ECC engine. The memory cell array may include a normal cell region and a parity cell region and each of the plurality of semiconductor memory devices 201a~201e, 202a~202e, 203a~203e, and 204a~204e may be set to one of a normal mode and a poison mode, individually. When some of the plurality of semiconductor memory devices 201a~201e, 202a~202e, 203a~203e, and 204a~204e are set to the poison mode, some of the plurality of semiconductor memory devices 201a~201e, 202a~202e, 203a~203e, and 204a~204e may store the poison flag PF in the parity cell region as meta data.

The RCD 690 may provide a command/address signal (e.g., CA) to the semiconductor memory devices 201a~201e through a command/address transmission line 661 and may provide a command/address signal to the semiconductor memory devices 202a~202e through a command/address transmission line 663. In addition, the RCD 690 may provide a command/address signal to the semiconductor memory devices 203a~203e through a command/address transmission line 671 and may provide a command/address signal to the semiconductor memory devices 204a~204e through a command/address transmission line 673.

The command/address transmission lines 661 and 663 may be connected in common to the module resistance unit 660 adjacent to the first edge portion 603, and the command/address transmission lines 671 and 673 may be connected in common to the module resistance unit 670 adjacent to the second edge portion 605. Each of the module resistance units 660 and 670 may include a termination resistor Rtt/2 connected to a termination voltage Vtt. In this case, an arrangement of the module resistance units 160 and 170 may reduce the number of the module resistance units, thus reducing an area where termination resistors are disposed.

The SPD chip 680 may be adjacent to the RCD 690 and the PMIC 685 may be between the semiconductor memory device 203e and the second edge portion 605. The PMIC 685 may generate a power supply voltage VDD based on the input voltage VIN and may provide the power supply voltage VDD to the semiconductor memory devices 201a~201e, 202a~202e, 203a~203e, and 204a~204e.

The RCD 690 may control the semiconductor memory devices 201a~201e, 202a~202e, 203a~203e, and 204a~204e and the PMIC 685 under control of the memory controller 100. The RCD 690 may receive an address ADDR, a command CMD, and a clock signal CK from the memory controller 100.

The SPD chip 680 may be a programmable read only memory (e.g., EEPROM). The SPD chip 680 may include initial information or device information DI of the memory module 600. In example embodiments, the SPD chip 680 may include the initial information or the device information DI such as a module form, a module configuration, a storage capacity, a module type, an execution environment, or the like of the memory module 600.

When a memory system including the memory module 600 is booted up, a host may read the device information DI from the SPD chip 680 and may recognize the memory module 600 based on the device information DI. The host may control the memory module 600 based on the device information DI from the SPD chip 680. For example, the host may recognize a type of the semiconductor memory devices 201a~201e, 202a~202e, 203a~203e, and 204a~204e included in the memory module 600 based on the device information DI from the SPD chip 680.

In example embodiments, the SPD chip 680 may communicate with the host through a serial bus. For example, the host may exchange a signal with the SPD chip 680 through the serial bus. The SPD chip 680 may also communicate with the RCD 690 through the serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

Figure 23:
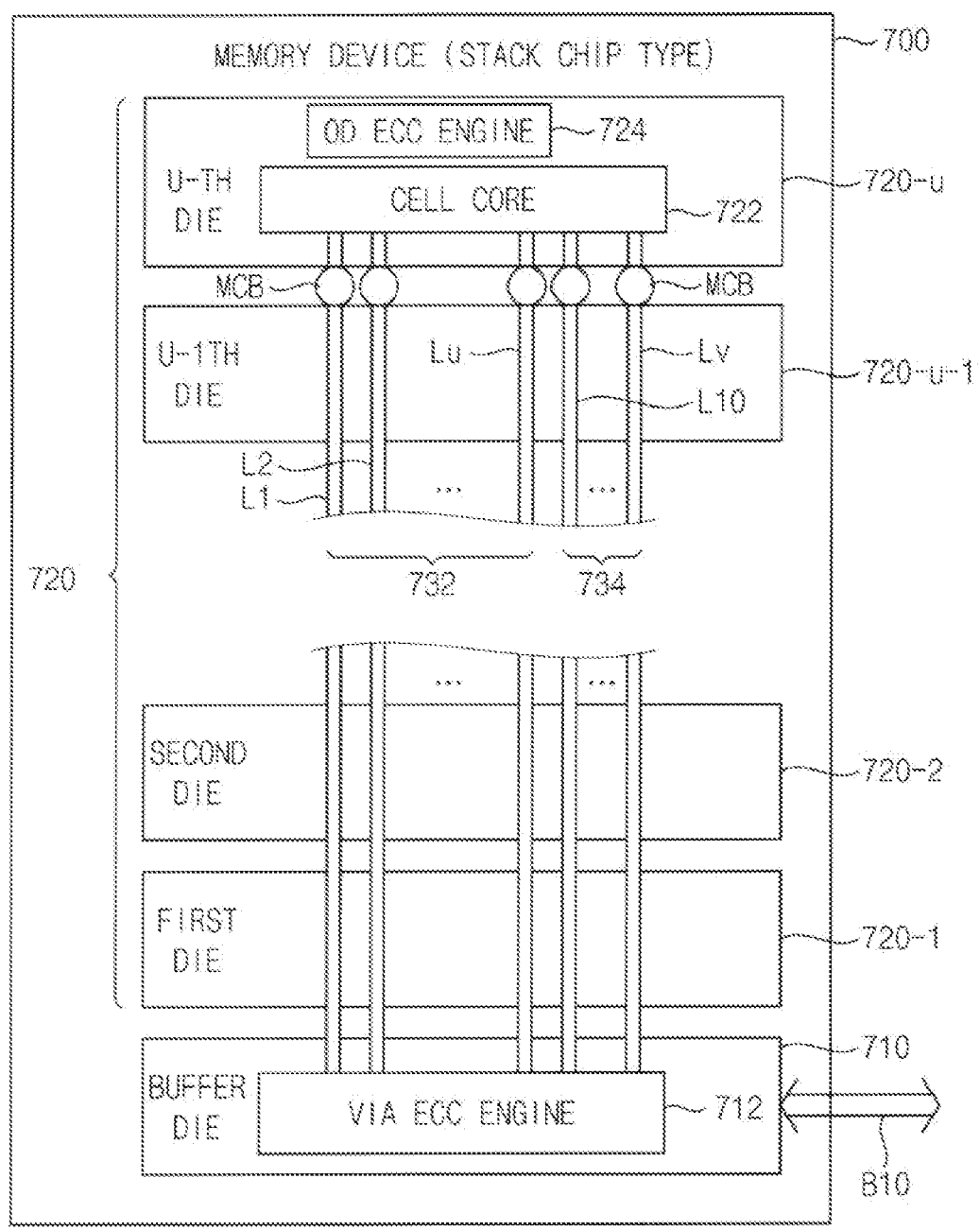
FIG. 23 is a block diagram illustrating a semiconductor memory device according to example embodiments.

FIG. 23 is a block diagram illustrating a semiconductor memory device according to example embodiments.

Referring to FIG. 23, a semiconductor memory device 700 may include at least one buffer die 710 and a group die 720 providing a soft error analyzing and correcting function in a stacked chip structure.

The group die 720 may include a plurality of memory dies 720-1 to 720-u (u is a natural number greater than two) which is stacked on the at least one buffer die 710 and convey data through a plurality of silicon via (TSV) lines.

Each of the memory dies 720-1 to 720u may include a cell core 722 and an on-die ECC engine 724 and the cell core 722 may include a plurality of volatile memory cells coupled to a plurality of word-lines and a plurality of bit-lines.

The on-die ECC engine 624 may employ the on-die ECC engine 400 of FIG. 9.

Therefore, the on-die ECC engine 624 performs an ECC encoding on main data to generate first parity data using an ECC, replaces a portion of the first parity data with a poison flag to generate second parity data in a poison mode, stores the poison flag and the second parity data in a parity cell region, and performs an ECC decoding operation on the main data and the poison flag based on the second parity data to protect the poison flag. That is, the semiconductor memory device 700 may store the poison flag as meta data in the parity cell region without size overhead and the on-die ECC engine 624 may perform the ECC encoding operation based on the ECC which is used as a different code in the normal mode and the poison mode based on the poison mode signal. That is, a different code is used in normal mode for the ECC encoding operation as compared to the code used if in poison mode The at least one buffer die 710 may include a via ECC engine 712 which corrects a transmission error using the transmission parity bits when a transmission error is detected from the transmission data received through the TSV lines and generate error-corrected data.

The semiconductor memory device 700 may be a stack chip type memory device or a stacked memory device which conveys data and control signals through the TSV lines. The TSV lines may also be called through electrodes.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

With the above description, a data TSV line group 732 which is formed at one memory die 720-*u* may include TSV lines L1 to Lu, and a parity TSV line group 734 may include TSV lines L10 to Lv.

The TSV lines L1 to Lu of the data TSV line group 732 and the parity TSV lines L10 to Lv of the parity TSV line group 734 may be connected to micro bumps MCB which are correspondingly formed among the memory dies 720-1 to 720-*u*.

Each of the memory dies 720-1 to 720-*u* may include DRAM cells each including at least one access transistor and one storage capacitor.

The semiconductor memory device 700 may have a three-dimensional (3D) chip structure or a 2.5D chip structure to communicate with a memory controller through a data bus B10. The at least one buffer die 710 may be connected with the memory controller through the data bus B10.

The via ECC engine 712 may determine whether a transmission error occurs at the transmission data received through the data TSV line group 732, based on the transmission parity bits received through the parity TSV line group 734.

When a transmission error is detected, the via ECC engine 712 may correct the transmission error on the transmission data using the transmission parity bits. When the transmission error is uncorrectable, the via ECC engine 712 may output information indicating occurrence of an uncorrectable data error.

Figure 24:
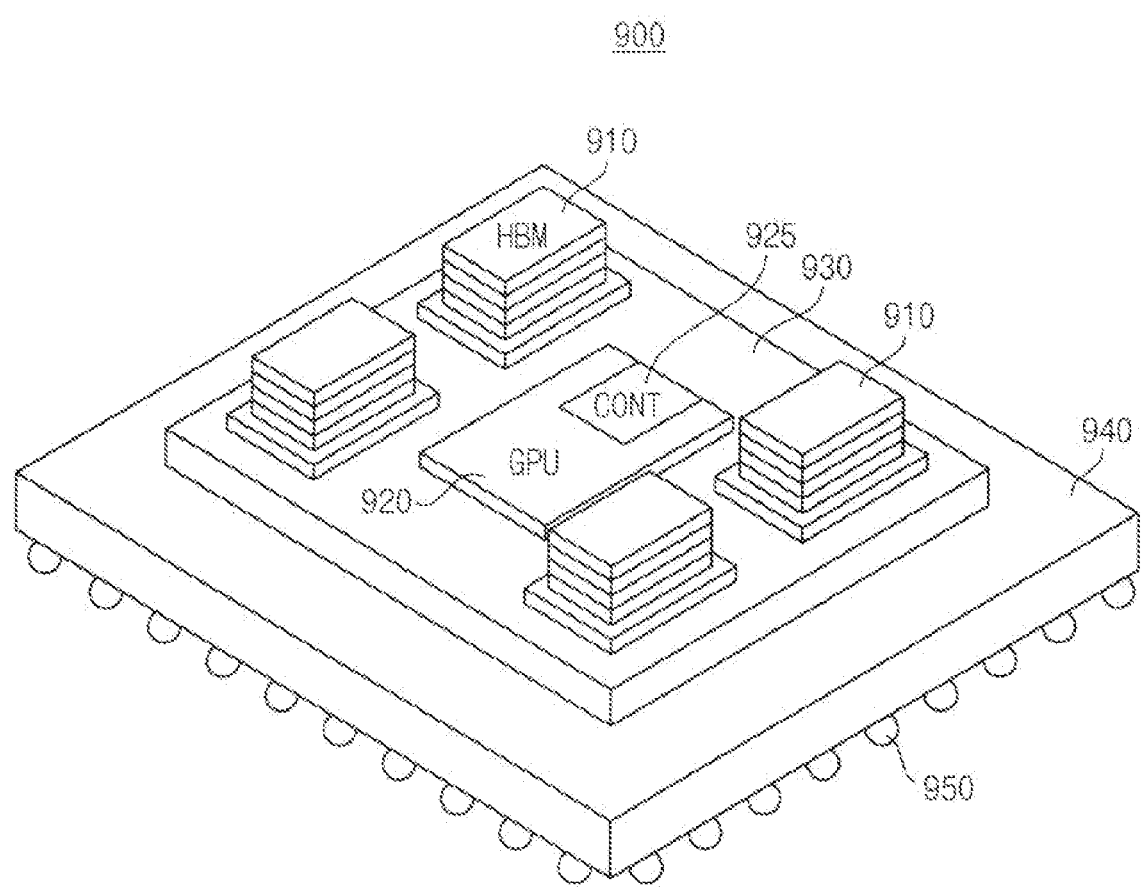
FIG. 24 is a diagram illustrating a semiconductor package including the stacked memory device according to example embodiments.

FIG. 24 is a diagram illustrating a semiconductor package including the stacked memory device according to example embodiments.

Referring to FIG. 24, a semiconductor package 900 may include one or more stacked memory devices 910 and a GPU 920 (graphic processing unit) and the GPU 920 may include a memory controller 925.

The stacked memory devices 910 and the GPU 920 may be on an interposer 930 (such as via mounting), and the interposer on which the stacked memory devices 910 and the GPU 920 are on may be on a package substrate 940 (such as by mounting). The package substrate 940 may be on solder balls 950 (such as by mounting). The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, and each of the plurality of memory dies may include a memory cell array and an on-die ECC engine and the buffer die may include a via ECC engine.

The plurality of stacked memory devices 910 may be on the interposer 930 (such as by mounting), and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

As mentioned above, in the semiconductor memory device according to example embodiments, the on-die ECC engine performs an ECC encoding on the main data to generate the first parity data using an ECC, replaces a portion of the first parity data with the poison flag to generate the second parity data in the poison mode, stores the poison flag and the second parity data in a parity cell region, and performs an ECC decoding operation on the main data and the poison flag based on the second parity data to protect the poison flag. That is, the semiconductor memory device may store the poison flag as meta data in the parity cell region without size overhead and the on-die ECC engine may perform the ECC encoding operation based on the ECC which is used as a different code in the normal mode and the poison mode based on the poison mode signal. That is, a different code is used in normal mode for the ECC encoding operation as compared to the code used if in poison mode The present disclosure may be applied to semiconductor memory devices and memory systems employing the ECC.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor memory device comprising:
    a memory cell array;
    an on-die error correction code (ECC) engine, based on an ECC, configured to, in a write operation:
        perform an ECC encoding operation on main data received from a memory controller to generate first parity data;
        selectively replace a portion of the first parity data with a poison flag to generate second parity data based on a poison mode signal, wherein the poison mode signal designates a normal mode or a poison mode;
        output the second parity data and the poison flag;
        provide the main data to a normal cell region in a target page of the memory cell array; and
        provide the first parity data to a parity cell region in the target page in the normal mode or provide the poison flag and the second parity data to the parity cell region in the poison mode; and
    a control logic circuit configured to control the on-die ECC engine and to generate the poison mode signal based on a command and an address from the memory controller.

2. The semiconductor memory device of claim 1, wherein, in response to the poison mode signal designating the poison mode, the on-die ECC engine is configured to:
    replace a first parity bit of the first parity data with the poison flag to generate the second parity data; and
    provide the poison flag and the second parity data to the parity cell region.

3. The semiconductor memory device of claim 1, wherein the on-die ECC engine is configured to:
    provide one or more of the main data, the first parity data, the second parity data, and the poison flag in a codeword to the target page of the memory cell array;

store the main data in the normal cell region in the target page and store one or more of the first parity data, the second parity data, and the poison flag in the parity cell region in the target page;
perform a single error correction/double error detection (SECDED) in the normal mode; and
perform a single error correction (SEC) in the poison mode.

4. The semiconductor memory device of claim 1, wherein the poison flag indicates whether the main data corresponds to poisoned data.

5. The semiconductor memory device of claim 1, wherein the control logic circuit comprises a mode register that is set to the poison mode based on the command, and
wherein the control logic circuit is configured to output the poison mode signal with a first logic level in response to the mode register being set to the poison mode.

6. The semiconductor memory device of claim 1, wherein, in a read operation, the on-die ECC engine, in response to the poison mode signal designating the poison mode, is configured to:
receive the main data read from the normal cell region in the target page;
receive the poison flag and the second parity data read from the parity cell region in the target page; and
perform an ECC decoding operation on the main data and the poison flag based on the second parity data using the ECC to correct an error bit in the main data and the poison flag.

7. The semiconductor memory device of claim 1, wherein, in a read operation, the on-die ECC engine, in response to the poison mode signal designating the normal mode, is configured to:
receive the main data read from the normal cell region in the target page;
receive the first parity data read from the parity cell region in the target page; and
perform an ECC decoding operation on the main data based on the first parity data using the ECC to correct one error bit in the main data and detect two error bits in the main data.

8. The semiconductor memory device of claim 1, wherein the on-die ECC engine comprises:
a memory to store the ECC;
an ECC encoder, connected to the memory, configured to perform an ECC encoding operation on the main data to generate the first parity data;
a selective poison flag injector configured to:
receive the poison mode signal, the poison flag and the first parity data;
selectively replace a portion of the first parity data with the poison flag to generate the second parity data; and output the second parity data and the poison flag; and
an ECC decoder, connected to the memory, configured to:
perform an ECC decoding operation on the main data read from the normal cell region in the target page using the first parity data read from the parity cell region in the target page; or
perform an ECC decoding operation on the main data read from the normal cell region in the target page and the poison flag read from the parity cell region in the target page using the second parity data read from the parity cell region in the target page.

9. The semiconductor memory device of claim 8, wherein:

the main data comprises a plurality of data bits divided into a plurality of sub data units;
the ECC is represented by a parity check matrix that comprises a plurality of column vectors and a plurality of parity vectors which are divided into a plurality of code groups corresponding to the sub data units and the first parity data; and
the control logic circuit, in response to the poison mode signal designating the poison mode, is configured to:
don't care process a row associated with a first parity bit of the first parity data among a plurality of rows of the parity check matrix that comprises a plurality of column vectors and a plurality of parity vectors; and
change a first parity vector associated with the first parity bit among the plurality of parity vectors such that elements of the first parity vector are not overlapped with elements of each of the plurality of column vectors and elements of second parity vectors among the plurality of parity vectors except the first parity vector to generate a modified parity check matrix.

10. The semiconductor memory device of claim 9, wherein, in the poison mode, the ECC encoder is configured to perform the ECC encoding operation on the main data and the poison flag using the modified parity check matrix.

11. The semiconductor memory device of claim 9, wherein, in the poison mode, the ECC decoder is configured to perform the ECC decoding operation on the main data and the poison flag using the modified parity check matrix and the second parity data.

12. The semiconductor memory device of claim 9, wherein, in the poison mode, the selective poison flag injector is configured to:
replace the first parity bit with the poison flag; and
replace second parity bits associated with the first parity vector that was changed among the plurality of parity vectors with a result of performing an XOR operation on each of the second parity bits and the poison flag.

13. The semiconductor memory device of claim 9, wherein the ECC decoder comprises:
a syndrome generation circuit configured to generate a syndrome based on the parity check matrix, the main data, and the first parity data in the normal mode, and to generate the syndrome based on the modified parity check matrix, the main data, and the second parity data in the poison mode;
a modified syndrome generator configured to generate a modified syndrome by selectively replacing a first syndrome bit of the syndrome with the first parity bit and by replacing second syndrome bits associated with the first parity vector that was changed among syndrome bits of the syndrome except the first syndrome bit with a result of performing an XOR operation on each of the second parity bits and the first parity bit;
an error locator configured to detect an error in the main data or detect an error in the main data and the poison flag based on the modified syndrome and configured to output an error vector indicating a position of the error that was detected; and
an error corrector configured to correct the error in the main data or correct the error in the main data and the poison flag based on the error vector and configured to output a corrected main data or a corrected poison flag.

14. The semiconductor memory device of claim 13, wherein, in the poison mode, the modified syndrome generator is configured to generate the modified syndrome by replacing the first syndrome bit with the first parity bit and by replacing the second syndrome bits with the result of performing an XOR operation on each of the second parity bits and the first parity bit based on the poison mode signal;

the error locator is configured to detect the error in the main data and the poison flag based on the modified syndrome and configured to output the error vector indicating a location of the error that was detected; and an error corrector is configured to correct the error in the main data and the poison flag based on the error vector and configured to output the corrected main data or the corrected poison flag.

15. The semiconductor memory device of claim 1, wherein the on-die ECC engine is configured to perform the ECC encoding operation and the ECC decoding operation using a different code in the normal mode as compared to a code used in the poison mode based on the poison mode signal, wherein the on-die ECC engine is further configured to modify a code used in the normal mode to provide a modified code to be used in the poison mode.

16. The semiconductor memory device of claim 15, comprising:

at least one buffer die; and a plurality of memory dies stacked on the at least one buffer die and configured to transmit and receive data through a plurality of through silicon via (TSV) lines, and wherein at least one of the plurality of memory dies may comprise the memory cell array, the on-die ECC engine, and the control logic circuit.

17. A memory system comprising:

a semiconductor memory device; and a memory controller configured to control the semiconductor memory device and configured to transmit main data and a poison flag to the semiconductor memory device, wherein the semiconductor memory device comprises:

a memory cell array;

an on-die error correction code (ECC) engine, based on an ECC, configured to, in a write operation:

perform an ECC encoding operation on the main data to generate first parity data;

selectively replace a portion of the first parity data with the poison flag to generate second parity data based on a poison mode signal, wherein the poison mode signal designates a normal mode or a poison mode;

output the second parity data and the poison flag;

provide the main data to a normal cell region in a target page of the memory cell array; and provide the first parity data to a parity cell region in the target page in the normal mode or provide the poison flag and the second parity data to the parity cell region in the poison mode; and a control logic circuit configured to control the on-die ECC engine and to generate the poison mode signal based on a command and an address from the memory controller.

18. The memory system of claim 17, wherein, in response to the poison mode signal designating the poison mode, the on-die ECC engine is configured to:

replace a first parity bit of the first parity data with the poison flag to generate the second parity data; and provide the poison flag and the second parity data to the parity cell region, and wherein the on-die ECC engine is configured to:

perform a single error correction/double error detection (SECDED) in the normal mode; and perform a single error correction (SEC) in the poison mode.

19. The memory system of claim 17, wherein the memory controller comprises:

a poison flag generator configured to generate the poison flag under control of the control logic circuit, the poison flag indicating whether the main data corresponds to poisoned data, and wherein, in a read operation, the on-die ECC engine, in response to the poison mode signal designating the poison mode, is configured to:

receive the main data read from the normal cell region in the target page;

receive the poison flag and the second parity data read from the parity cell region in the target page;

perform an ECC decoding operation on the main data and the poison flag based on the second parity data using the ECC to correct an error bit in the main data and the poison flag; and transmit the main data and the poison flag to the memory controller.

20. A semiconductor memory device comprising:

a memory cell array;

an on-die error correction code (ECC) engine, based on an ECC, configured to, in a write operation:

perform an ECC encoding operation on main data received from an external memory controller to generate first parity data;

selectively replace a portion of the first parity data with a poison flag received from the external memory controller to generate second parity data, based on a poison mode signal, wherein the poison mode signal designates a normal mode or a poison mode;

output the second parity data and the poison flag;

provide the main data to a normal cell region in a target page of the memory cell array; and provide the first parity data to a parity cell region in the target page in the normal mode or provide the poison flag and the second parity data to the parity cell region in the poison mode;

a control logic circuit configured to control the on-die ECC engine and to generate the poison mode signal based on a command and an address from the external memory controller, and wherein, in a read operation, the on-die ECC engine, in response to the poison mode signal designating the poison mode, is configured to:

receive the main data read from the normal cell region in the target page;

receive the poison flag and the second parity data read from the parity cell region in the target page; and perform an ECC decoding operation on the main data and the poison flag based on the second parity data using the ECC to correct an error bit in the main data and the poison flag, wherein, in a read operation, the on-die ECC engine, in response to the poison mode signal designating the normal mode, is configured to:

receive the main data read from the normal cell region in the target page;

receive the first parity data read from the parity cell region in the target page; and perform an ECC decoding operation on the main data based on the first parity data using the ECC to correct one error bit in the main data and detect two error bits in the main data, wherein the main data comprises a plurality of data bits divided into a plurality of sub data units, wherein the ECC is represented by a parity check matrix that comprises a plurality of column vectors and a plurality of parity vectors which are divided into a plurality of code groups corresponding to the sub data units and the first parity data, and wherein the control logic circuit is configured to:
 perform don't care process on a row associated with a first parity bit of the first parity data among a plurality of rows of the parity check matrix; and
 change a first parity vector associated with the first parity bit among the plurality of parity vectors such that elements of the first parity vector are not overlapped with elements of each of the plurality of column vectors and elements of second parity vectors among the plurality of parity vectors except the first parity vector to generate a modified parity check matrix.

* * * * *